US012701701B2

(12) United States Patent
Purayath et al.

(10) Patent No.: US 12,701,701 B2
(45) Date of Patent: Aug. 4, 2026

(54) METHODS FOR FABRICATION OF 3-DIMENSIONAL NOR MEMORY ARRAYS

(71) Applicant: SUNRISE MEMORY CORPORATION, San Jose, CA (US)

(72) Inventors: Vinod Purayath, Sedona, AZ (US); Wu-Yi Henry Chien, San Jose, CA (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 740 days.

(21) Appl. No.: 17/714,776

(22) Filed: Apr. 6, 2022

(65) Prior Publication Data

US 2022/0344364 A1      Oct. 27, 2022

Related U.S. Application Data

(60) Provisional application No. 63/177,803, filed on Apr. 21, 2021.

(51) Int. Cl.
    *H10B 43/20*          (2023.01)
(52) U.S. Cl.
    CPC .................................... *H10B 43/20* (2023.02)
(58) Field of Classification Search
    CPC .................................................... H10B 43/20
    See application file for complete search history.

(56) References Cited

U.S. PATENT DOCUMENTS 4,213,139 A      7/1980    Rao
5,583,808 A    12/1996    Brahmbhatt 5,646,886 A      7/1997    Brahmbhatt
5,656,842 A      8/1997    Iwamatsu
5,768,192 A      6/1998    Eitan
5,789,776 A      8/1998    Lancaster et al.
5,880,993 A      3/1999    Kramer et al.
5,915,167 A      6/1999    Leedy
6,040,605 A      3/2000    Sano et al.
6,107,133 A      8/2000    Furukawa
6,118,171 A      9/2000    Davies et al.
6,130,838 A    10/2000    Kim et al.
6,313,518 B1    11/2001    Ahn et al.
(Continued)

FOREIGN PATENT DOCUMENTS

JP      2006099827 A1    4/2006
JP      2010108522 A1    5/2010
(Continued)

OTHER PUBLICATIONS

"EP Extended Search Report EP168690149.3", Oct. 18, 2019.
(Continued)

*Primary Examiner* — Joshua Benitez Rosario
*Assistant Examiner* — Christopher A Culbert

(57)                   ABSTRACT

Carbon has many advantageous uses as a sacrificial material in the fabricating thin-film storage transistors, such as those organized as NOR memory strings. In one implementation, the carbon layers are replaced by heavily doped n-type polysilicon source and drain regions at a late step during device fabrication. As a result, many high temperature steps within the fabrication process may now be carried out without concern for thermal diffusion from the heavily doped polysilicon, thus allowing phosphorus to be used as the n-type dopant.

13 Claims, 23 Drawing Sheets

(56)    References Cited

U.S. PATENT DOCUMENTS

| | | | |
|---|---|---|---|
| 6,314,046 B1 | 11/2001 | Kamiya et al. |
| 6,362,508 B1 | 3/2002 | Rasovaky et al. |
| 6,434,053 B1 | 8/2002 | Fujiwara |
| 6,580,124 B1 | 6/2003 | Cleeves et al. |
| 6,744,094 B2 | 6/2004 | Forbes |
| 6,754,105 B1 | 6/2004 | Chang et al. |
| 6,774,458 B2 | 8/2004 | Fricke et al. |
| 6,873,004 B1 | 3/2005 | Han et al. |
| 6,881,994 B2 | 4/2005 | Lee et al. |
| 6,946,703 B2 | 9/2005 | Ryu et al. |
| 7,005,350 B2 | 2/2006 | Walker et al. |
| 7,223,653 B2 | 5/2007 | Cheng et al. |
| 7,307,308 B2 | 12/2007 | Lee |
| 7,489,002 B2 | 2/2009 | Forbes et al. |
| 7,512,012 B2 | 3/2009 | Kuo |
| 7,524,725 B2 | 4/2009 | Chung |
| 7,542,348 B1 | 6/2009 | Kim |
| 7,612,411 B2 | 11/2009 | Walker |
| 7,804,145 B2 | 9/2010 | Shimizu et al. |
| 8,026,521 B1 | 9/2011 | Or-Bach et al. |
| 8,139,418 B2 | 3/2012 | Carman |
| 8,178,396 B2 | 5/2012 | Sinha et al. |
| 8,278,183 B2 | 10/2012 | Lerner |
| 8,383,482 B2 | 2/2013 | Kim et al. |
| 8,395,942 B2 | 3/2013 | Samachisa et al. |
| 8,604,618 B2 | 12/2013 | Cooney et al. |
| 8,630,114 B2 | 1/2014 | Lue |
| 8,743,612 B2 | 6/2014 | Choi et al. |
| 8,767,473 B2 | 7/2014 | Shim et al. |
| 8,848,425 B2 | 9/2014 | Schloss |
| 8,878,278 B2 | 11/2014 | Alsmeier et al. |
| 9,190,293 B2 | 11/2015 | Wang et al. |
| 9,202,694 B2 | 12/2015 | Konevecki et al. |
| 9,230,985 B1 | 1/2016 | Wu et al. |
| 9,299,580 B2 | 3/2016 | Kong et al. |
| 9,412,752 B1 | 8/2016 | Yeh et al. |
| 9,455,268 B2 | 9/2016 | Oh et al. |
| 9,620,605 B2 | 4/2017 | Liang et al. |
| 9,633,944 B2 | 4/2017 | Kim |
| 9,698,152 B2 | 7/2017 | Peri |
| 9,711,529 B2 | 7/2017 | Hu et al. |
| 9,748,172 B2 | 8/2017 | Takaki |
| 9,799,761 B2 | 10/2017 | Or-Bach et al. |
| 9,842,651 B2 | 12/2017 | Harari |
| 9,892,800 B2 | 2/2018 | Harari |
| 9,911,497 B1 | 3/2018 | Harari |
| 10,014,317 B2 | 7/2018 | Peng |
| 10,074,667 B1 | 9/2018 | Higashi |
| 10,096,364 B2 | 10/2018 | Harari |
| 10,121,553 B2 | 11/2018 | Harari |
| 10,157,780 B2 | 12/2018 | Wu et al. |
| 10,217,667 B2 | 2/2019 | Or-Bach et al. |
| 10,249,370 B2 | 4/2019 | Harari |
| 10,254,968 B1 | 4/2019 | Gazit et al. |
| 10,283,493 B1 | 5/2019 | Nishida |
| 10,319,696 B1 | 6/2019 | Nakano |
| 10,373,956 B2 | 8/2019 | Gupta et al. |
| 10,381,370 B2 | 8/2019 | Shin et al. |
| 10,381,378 B1 | 8/2019 | Harari |
| 10,395,737 B2 | 8/2019 | Harari |
| 10,431,596 B2 | 10/2019 | Herner et al. |
| 10,475,812 B2 | 11/2019 | Harari |
| 10,608,011 B2 | 3/2020 | Harari et al. |
| 10,622,377 B2 | 4/2020 | Harari et al. |
| 10,651,153 B2 | 5/2020 | Fastow et al. |
| 10,651,196 B1 | 5/2020 | Sharangpani et al. |
| 10,692,837 B1 | 6/2020 | Nguyen et al. |
| 10,692,874 B2 | 6/2020 | Harari et al. |
| 2001/0030340 A1 | 10/2001 | Fujiwara |
| 2001/0053092 A1 | 12/2001 | Kosaka et al. |
| 2002/0012271 A1 | 1/2002 | Forbes |
| 2002/0028541 A1 | 3/2002 | Lee et al. |
| 2002/0051378 A1 | 5/2002 | Ohsawa |
| 2002/0193484 A1 | 12/2002 | Albee |
| 2003/0038318 A1 | 2/2003 | Forbes |

| | | | |
|---|---|---|---|
| 2004/0214387 A1 | 10/2004 | Madurawe et al. |
| 2004/0246807 A1 | 12/2004 | Lee |
| 2004/0262681 A1 | 12/2004 | Masuoka et al. |
| 2004/0262772 A1 | 12/2004 | Ramanathan et al. |
| 2004/0264247 A1 | 12/2004 | Kim |
| 2005/0128815 A1 | 6/2005 | Ishikawa et al. |
| 2005/0280061 A1 | 12/2005 | Lee |
| 2006/0001083 A1 | 1/2006 | Bhattacharyya |
| 2006/0155921 A1 | 7/2006 | Gorobets et al. |
| 2007/0012987 A1 | 1/2007 | McTeer |
| 2007/0045711 A1 | 3/2007 | Bhattacharyya |
| 2007/0134876 A1 | 6/2007 | Lai et al. |
| 2008/0160765 A1 | 7/2008 | Lee et al. |
| 2008/0178794 A1 | 7/2008 | Cho et al. |
| 2008/0239812 A1 | 10/2008 | Naofumi et al. |
| 2008/0266960 A1 | 10/2008 | Kuo |
| 2008/0301359 A1 | 12/2008 | Smith |
| 2009/0057722 A1 | 3/2009 | Masuoka et al. |
| 2009/0157946 A1 | 6/2009 | Arya |
| 2009/0237996 A1 | 9/2009 | Kirsch et al. |
| 2009/0268519 A1 | 10/2009 | Ishii |
| 2009/0279360 A1 | 11/2009 | Peter et al. |
| 2009/0290442 A1 | 11/2009 | Rajan |
| 2009/0316487 A1 | 12/2009 | Lee et al. |
| 2010/0013001 A1 | 1/2010 | Cho et al. |
| 2010/0121994 A1 | 5/2010 | Kim et al. |
| 2010/0124116 A1 | 5/2010 | Takashi et al. |
| 2010/0128509 A1 | 5/2010 | Kim et al. |
| 2010/0219392 A1 | 9/2010 | Awaya et al. |
| 2010/0254191 A1 | 10/2010 | Son et al. |
| 2010/0327413 A1 | 12/2010 | Lee et al. |
| 2011/0044113 A1 | 2/2011 | Kim |
| 2011/0115011 A1 | 5/2011 | Masuoka et al. |
| 2011/0134705 A1 | 6/2011 | Jones et al. |
| 2011/0170266 A1 | 7/2011 | Haensh et al. |
| 2011/0208905 A1 | 8/2011 | Shaeffer et al. |
| 2011/0298013 A1 | 12/2011 | Hwang et al. |
| 2011/0310683 A1 | 12/2011 | Gorobets |
| 2012/0182801 A1 | 7/2012 | Lue |
| 2012/0208347 A1 | 8/2012 | Hwang et al. |
| 2012/0243314 A1 | 9/2012 | Takashi |
| 2012/0307568 A1 | 12/2012 | Banna et al. |
| 2012/0327714 A1 | 12/2012 | Lue |
| 2013/0031325 A1 | 1/2013 | Nakamoto et al. |
| 2013/0256780 A1 | 10/2013 | Kai et al. |
| 2014/0015036 A1 | 1/2014 | Fursin et al. |
| 2014/0040698 A1 | 2/2014 | Loh et al. |
| 2014/0075135 A1 | 3/2014 | Choi et al. |
| 2014/0117366 A1 | 5/2014 | Saitoh |
| 2014/0151774 A1 | 6/2014 | Rhie |
| 2014/0213032 A1 | 7/2014 | Kai et al. |
| 2014/0229131 A1 | 8/2014 | Cohen et al. |
| 2014/0247674 A1 | 9/2014 | Karda et al. |
| 2014/0328128 A1 | 11/2014 | Louie et al. |
| 2014/0340952 A1 | 11/2014 | Ramaswamy et al. |
| 2015/0054507 A1 | 2/2015 | Gulaka et al. |
| 2015/0098272 A1 | 4/2015 | Kasolra et al. |
| 2015/0113214 A1 | 4/2015 | Sutardja |
| 2015/0155876 A1 | 6/2015 | Jayasena et al. |
| 2015/0194440 A1 | 7/2015 | Noh et al. |
| 2015/0249143 A1 | 9/2015 | Sano |
| 2015/0263005 A1 | 9/2015 | Zhao et al. |
| 2015/0372099 A1 | 12/2015 | Chen et al. |
| 2016/0013156 A1 | 1/2016 | Zhai et al. |
| 2016/0019951 A1 | 1/2016 | Park et al. |
| 2016/0035711 A1 | 2/2016 | Hu |
| 2016/0086970 A1 | 3/2016 | Peng |
| 2016/0141294 A1 | 5/2016 | Peri et al. |
| 2016/0225860 A1 | 8/2016 | Karda et al. |
| 2016/0300724 A1 | 10/2016 | Levy et al. |
| 2016/0314042 A1 | 10/2016 | Plants |
| 2016/0358934 A1 | 12/2016 | Lin et al. |
| 2017/0053906 A1 | 2/2017 | Or-Bach et al. |
| 2017/0092370 A1* | 3/2017 | Harari .............. G11C 11/5628 |
| 2017/0092371 A1 | 3/2017 | Harari |
| 2017/0148517 A1 | 5/2017 | Harari |
| 2017/0148810 A1 | 5/2017 | Kai et al. |
| 2017/0194341 A1 | 7/2017 | Yamada |
| 2017/0213731 A1 | 7/2017 | Yoon et al. |

(56) References Cited

U.S. PATENT DOCUMENTS

| | | |
|---|---|---|
| 2017/0213821 A1 | 7/2017 | Or-Bach et al. |
| 2017/0358594 A1 | 12/2017 | Lu et al. |
| 2018/0095127 A1 | 4/2018 | Pappu et al. |
| 2018/0108416 A1 | 4/2018 | Harari |
| 2018/0269229 A1 | 9/2018 | Or-Bach et al. |
| 2018/0331042 A1 | 11/2018 | Manusharow et al. |
| 2018/0342455 A1 | 11/2018 | Nosho et al. |
| 2018/0342544 A1 | 11/2018 | Lee et al. |
| 2018/0366471 A1 | 12/2018 | Harari et al. |
| 2018/0366485 A1 | 12/2018 | Harari |
| 2018/0366489 A1 | 12/2018 | Harari et al. |
| 2019/0006009 A1 | 1/2019 | Harari |
| 2019/0019564 A1 | 1/2019 | Li et al. |
| 2019/0067327 A1 | 2/2019 | Herner et al. |
| 2019/0157296 A1 | 5/2019 | Harari et al. |
| 2019/0180821 A1 | 6/2019 | Harari |
| 2019/0206890 A1 | 7/2019 | Harari et al. |
| 2019/0214077 A1 | 7/2019 | Oh et al. |
| 2019/0238134 A1 | 8/2019 | Lee et al. |
| 2019/0244971 A1 | 8/2019 | Harari |
| 2019/0259769 A1 | 8/2019 | Karda et al. |
| 2019/0303042 A1 | 10/2019 | Kim et al. |
| 2019/0319044 A1 | 10/2019 | Harari |
| 2019/0325945 A1 | 10/2019 | Linus |
| 2019/0325964 A1 | 10/2019 | Harari |
| 2019/0348424 A1 | 11/2019 | Karda et al. |
| 2019/0355747 A1 | 11/2019 | Herner et al. |
| 2019/0370117 A1 | 12/2019 | Fruchtman et al. |
| 2020/0020718 A1 | 1/2020 | Harari et al. |
| 2020/0051990 A1 | 2/2020 | Harari et al. |
| 2020/0098738 A1 | 3/2020 | Herner et al. |
| 2020/0098779 A1 | 3/2020 | Cernea et al. |
| 2020/0176468 A1 | 6/2020 | Herner et al. |
| 2020/0203378 A1 | 6/2020 | Harari et al. |
| 2020/0219572 A1 | 7/2020 | Harari |
| 2020/0258897 A1 | 8/2020 | Yan et al. |
| 2020/0403002 A1 | 12/2020 | Harari |
| 2022/0028876 A1 | 1/2022 | Purayath et al. |
| 2022/0028886 A1 | 1/2022 | Pur et al. |

FOREIGN PATENT DOCUMENTS

| | | |
|---|---|---|
| JP | 2010251572 A | 11/2010 |
| JP | 2011028540 A1 | 2/2011 |
| KR | 20120085591 A1 | 8/2012 |
| KR | 20120085603 A | 8/2012 |
| WO | 2018236937 A1 | 12/2018 |

OTHER PUBLICATIONS

"European Search Report, EP 16852238.1", Mar. 28, 2019.
"European Search Report, EP17844550.8", Aug. 12, 2020, 11 pages.

"Invitation to Pay Additional Fees (PCT/ISA/206), PCT/US2020/015710", Mar. 20, 2020, 2 pages.
"Invitation to Pay Additional Fees, PCT/US2019/065256", Feb. 13, 2020, 2 pages.
"Notification of Reasons for Refusal, Japanese Patent Application 2018-527740", (English translation), Nov. 4, 2020, 8 pages.
"Partial European Search Report EP 16869049.3", Jul. 1, 2019, pp. 1-12.
"PCT Search Report and Written Opinion, PCT/US2018/038373", Sep. 10, 2018.
"PCT Search Report and Written Opinion, PCT/US2018/067338", May 8, 2019.
"PCT Search Report and Written Opinion, PCT/US2019/014319", Apr. 15, 2019.
"PCT Search Report and Written Opinion, PCT/US2019/041678", Oct. 9, 2019.
"PCT Search Report and Written Opinion, PCT/US2019/052164", Feb. 27, 2020.
"PCT Search Report and Written Opinion, PCT/US2019/052446", Dec. 11, 2019.
"PCT Search Report and Written Opinion, PCT/US2019/065256", Apr. 14, 2020.
"PCT Search Report and Written Opinion, PCT/US2020/015710", Jun. 9, 2020.
"PCT Search Report and Written Opinion, PCT/US2020/017494", Jul. 20, 2020, 13 pages.
"PCT Search Report and Written Opinion, PCT/US2020/065374", Mar. 15, 2021, 17 pages.
"PCT Search Report and Written Opinion, PCT/US2020/065670", Apr. 5, 2021, 12 pages.
"PCT Search Report and Written Opinion, PCT/US2021/016964", Jun. 15, 2021, 19 pages.
"PCT Search Report and Written Opinion, PCT/US2021/025722", Jun. 15, 2021, 10 pages.
"PCT Search Report and Written Opinion, PCT/US2021/042607", Nov. 4, 2021, 17 pages.
"PCT Search Report and Written Opinion, PCT/US2021/42620", Oct. 28, 2021, 18 pages.
Hou, S. Y., et al., "Wafer-Leval Integration of an Advanced Logic-Memory System Through the Second-Generation CoWoS Technology", IEEE Transactions On Electron Devices, vol. 64, No. 10, Oct. 2017, 4071-4077.
Kim, N. , et al., "Multi-layered Vertical gate NANO Flash Overcoming Stacking Limit for Terabit Density Storage", Symposium on VLSI Tech. Dig. of Technical Papers, 2009, pp. 188-189.

* cited by examiner

CROSS-SECTION VIEW ALONG AA'

CROSS-SECTION VIEW ALONG AA'

CARBON HARDMASK

METHODS FOR FABRICATION OF 3-DIMENSIONAL NOR MEMORY ARRAYS

CROSS REFERENCE TO RELATED APPLICATIONS

The present application is related to and claims priority of U.S. provisional application ("Provisional Application I"), Ser. No. 63/177,803, entitled "Methods for Fabrication of 3-Dimensional NOR Memory Arrays," filed on Apr. 21, 2021.

The present application is also related to U.S. patent application ("Related Application I"), Ser. No. 17/382,064, entitled "Methods For Fabricating A 3-Dimensional Memory Structure Of NOR Memory Strings," filed on Jul. 21, 2021, which claims priority of U.S. provisional application ("Provisional Application II"), Ser. No. 63/054,743, entitled "Methods For Fabricating A 3-Dimensional Memory Structure Of NOR Memory Strings," filed on Jul. 21, 2020; and U.S. provisional ("Provisional Application III"), Ser. No. 63/054,750, entitled "Methods for Fabricating A 3-Dimensional Memory Structure of NOR Memory Strings," filed on Jul. 21, 2020.

The present application is also related to U.S. non-provisional patent application ("Related Application II"), Ser. No. 16/894,596, entitled "Capacitive-Coupled Non-Volatile Thin-Film Transistor Strings in Three Dimensional Arrays," filed on Jun. 5, 2020, which is a continuation of U.S. patent application, Ser. No. 16/107,118, entitled "Capacitive-Coupled Non-Volatile Thin-Film Transistor Strings in Three Dimensional Arrays," filed on Aug. 21, 2018, which is a divisional application of U.S. non-provisional patent application, Ser. No. 15/248,420, entitled "Capacitive-Coupled Non-Volatile Thin-Film Transistor Strings in Three Dimensional Arrays," filed on Aug. 26, 2016, which is related to and claims priority of (i) U.S. provisional application, Ser. No. 62/235,322, entitled "Multi-gate NOR Flash Thin-film Transistor Strings Arranged in Stacked Horizontal Active Strips With Vertical Control Gates," filed on Sep. 30, 2015; (ii) U.S. provisional patent application, Ser. No. 62/260,137, entitled "Three-dimensional Vertical NOR Flash Thin-film Transistor Strings," filed on Nov. 25, 2015; (iii) U.S. non-provisional patent application, Ser. No. 15/220,375, "Multi-Gate NOR Flash Thin-film Transistor Strings Arranged in Stacked Horizontal Active Strips With Vertical Control Gates," filed on Jul. 26, 2016; and (vi) U.S. provisional patent application, Ser. No. 62/363,189, entitled "Capacitive Coupled Non-Volatile Thin-film Transistor Strings," filed Jul. 15, 2016.

The disclosures of Related Applications I and II and Provisional Applications I, II, and III are hereby incorporated by reference in their entireties.

BACKGROUND OF THE INVENTION

1. Field of the Invention

The present invention relates to manufacturing processes for integrated circuits. In particular, the present invention relates to fabrication processes for thin-film storage transistors organized as NOR memory string arrays.

2. Discussion of the Related Art

Thin-film storage transistors organized as 3-dimensional arrays of NOR memory strings are disclosed, for example, in Related Application II. Briefly, in one implementation of a 3-dimensional array of NOR memory strings, the 3-dimensional array is formed out of thin films that are successively deposited over a planar surface of semiconductor substrate. The thin films may include a number (e.g., 2, 4, 8, 16 . . . ) of groups of thin films (hereinafter, each group of thin films being referred to as an "active layer"), each active layer being provided one on top of another and being separated from the other by an isolation dielectric layer (e.g., silicon oxycarbon (SiOC)). Each active layer is a multi-layer that includes a predetermined combination of various semiconductor, conductive and dielectric materials. For example, in Related Application II, each active layer includes first and second doped semiconductor layers (e.g., n$^+$ polysilicon) separated by a dielectric layer (e.g., silicon oxide). The active layer may also include one or more conductive layers (e.g., titanium nitride (TiN)-lined tungsten (W)), or sacrificial layers (e.g., silicon nitride) to be subsequently replaced by final conductive layers. In that arrangement, the conductive layers each contact one of the semiconductor layers to provide a signal path of reduced resistivity in the adjacent semiconductor layer it contacts.

After their depositions, the thin films are then cut by the manufacturing process (e.g., by one or more etching steps) to provide narrow trenches that extend lengthwise along a direction substantially parallel to the planar surface (hereinafter, a direction that is parallel to the planar surface is referred to as a "horizontal" direction). These trenches have a depth that extends "vertically" (i.e., along a direction normal to the planar surface) through all or almost all of the thin films, thereby dividing each active layer into narrow strips ("active strips") stacked one on top of another. These stacks of active strips ("active stacks") are separated from each other by the trenches along a direction orthogonal to both the vertical direction and the lengthwise direction of the active strips.

Subsequent processing steps form the NOR memory strings from the active strips. Specifically, as provided in Related Application II, the subsequent processing steps form channel regions (e.g., p$^-$ polysilicon), charge-storage layers (e.g., oxide-nitride-oxide (ONO) multilayers) and gate electrodes (e.g., TiN-lined W). In Related Application II, each gate electrode extends lengthwise in the vertical direction over the depth of the trench. The semiconductor layers of each active strip provide a source region ("common source line") and a drain region ("common bit line") to the storage transistors along one or both sides of the active strip. A storage transistor is formed by the common source line, the common bit line, a channel region in contact with both the common source line and the common bit line, a gate electrode and the portion of a charge-storage layer that is situated between the gate electrode and the channel region. The gate electrodes are also referred to herein as "local word lines." Along each active strip, the storage transistors that share the common source line and the common bit line form a NOR memory string (referred herein as a "Horizontal NOR memory string" or "HNOR memory string").

Related Application II also discloses forming, prior to depositions of the thin-films, various types of circuits in or at the surface of the semiconductor substrate to support the operations of the HNOR memory strings to be formed. Such circuits, referred to as "circuits under array" ("CUAs") may include various voltage sources for power supply, ground, programming, erase or read voltages, sense amplifiers, various latches and registers, various logic circuits, and various analog circuits. One or more interconnection conductive layers may provide conductors above, below—or both—the 3-dimensional arrays of HNOR memory strings to connect the common bit line, the common source line and the local word lines to the CUAs. Related Application II teaches that, in one implementation, the parasitic capacitance of the common source line is electrically connected to the CUA only briefly for pre-charging to a predetermined voltage. At other times, the common source line is electrically isolated to the CUAs and its pre-charged parasitic capacitance serves as a virtual voltage source (e.g., a virtual ground) during memory operations.

As each active layer includes at least two doped semiconductor layers, a dielectric layer therebetween, and at least one sacrificial layer provided either above the top semiconductor layer or below the bottom semiconductor layer, the successive depositions of these thin films pose a challenge. Specifically, the successive depositions of each active layer and its adjacent isolation dielectric layer involve at least four different materials, which render the processing significantly more complex than the successive deposition steps carried out in other 3-dimensional memory structures. For example, a process for manufacturing 3-dimensional "vertical" NAND memory string arrays typically requires merely successively depositing, alternately, silicon oxide and silicon nitride, allowing the successive depositions to be carried out all in a single chamber. While there is wide availability and experience with process chambers that handles the 2-color depositions in vertical NAND memory string manufacturing, a "4-color strata" reaction chamber capable of handing the four different materials in HNOR memory string manufacturing must be custom-designed at this time.

The need to prevent undesirable thermal diffusion of the dopants in the doped semiconductor layers (e.g., $n^+$ polysilicon) into the adjacent channel regions (e.g., $p^-$ polysilicon) poses another challenge, as the semiconductor layers are both opposite-doped and of much higher dopant density than the channel regions. To prevent this undesirable thermal diffusion, in addition to a strict thermal budget, arsenic or another dopant of relatively low diffusivity is used in the doped semiconductor layers. Using arsenic, rather than, for example, phosphorus, requires substantially more complex handling procedures.

SUMMARY

The present invention uses carbon as a sacrificial material in fabricating thin-film storage transistors, such as those organized as NOR memory strings.

According to one embodiment of the present invention, a process suitable for use in fabricating storage transistors of a NOR memory string above a planar surface of a semiconductor substrate includes: (a) above the planar surface, repeatedly depositing, alternately and one over another, a multi-layer and an isolation dielectric layers, each multilayer comprising first and second carbon layers and an interlayer dielectric layer that is provided between the first and the second carbon layers; (b) cutting trenches into the multilayers and the isolation dielectric layers, thereby exposing the carbon layers, the interlayer dielectric layers and the isolation dielectric layers at the sidewalls of the trenches, each trench having (i) a depth that extends along a first direction that is substantially normal to the planar surface, (ii) a length that extends along a second direction that is substantially parallel to the planar surface, (iii) a width that extends along a third direction that is substantially orthogonal to both the depth and the length, the length of the trench being substantially greater than its width; (c) etching the interlayer dielectric layer of each multi-layer exposed in the trenches to create a recess between the first carbon layer and the second carbon layer; (d) filling each recess with a first semiconductor layer of a first conductivity type; (e) filling the trenches with a first sacrificial material; (0 cutting via openings in the first sacrificial material of each trench and filling the via openings with a second sacrificial material; (g) replacing the remainder of the first sacrificial material in the trenches by a charge-storage layer and a conductor; (h) removing the second sacrificial material from the via openings; and (i) through the via openings, in place of each carbon layer of each multi-layer, providing a second semiconductor layer of a second conductivity type.

The interlayer dielectric layer and the isolation dielectric layer are preferably dielectric materials of different etch characteristics. The second semiconductor layer that is in place of the first carbon layer, the second semiconductor layer that is in place of the second carbon layer, the first semiconductor layer, the charge storage layer, and the conductor form a storage transistor of the NOR memory string.

In some embodiments of the present invention, replacing the remainder of the first sacrificial material in the trenches by the charge storage layer and the conductor includes (a) removing the remainder of the first sacrificial material create excavated portions in each trench, the excavated portions being separated from each other by the second sacrificial material filling the via openings; (b) in each excavated portion in each trench, depositing conformally the charge-storage layer on the sidewalls of the excavated portion; and (c) filling the excavated portion by the conductor.

The charge-storage layer comprises a tunneling layer, a charge-trapping layer and a blocking layer. In some embodiments of the present invention, these layers of the charge-storage layer may include one or more of: silicon oxide, zirconium oxide, one or more multi-layers each comprising silicon oxide and silicon nitride, aluminum oxide, and any combination thereof.

To provide a second semiconductor layer of a second conductivity type (i.e., a channel region) in place of each carbon layer of each multi-layer, a method of the present invention (a) removes the carbon layers by an ashing step that converts the carbon layers into carbon oxide gases, which are then expelled through the via openings, thereby creating a space in place of the carbon layers; and (b) depositing the second semiconductor layer into the space. The second semiconductor layer comprises a conformal polysilicon liner. A conductive material (e.g., tungsten) may be added into the space to reduce resistivity in the polysilicon liner.

According to a second embodiment of the present invention, a process suitable for use in fabricating storage transistors of a NOR memory string above a planar surface of a semiconductor substrate includes: (a) above the planar surface, repeatedly depositing, alternately and one over another, a multi-layer and an isolation dielectric layers, each multi-layer comprising first and second semiconductor layers, each of a first conductivity type, a carbon layer between the first and the second semiconductor layers; (b) cutting trenches into the multilayers and the isolation dielectric layers, thereby (1) exposing the carbon layers, the interlayer dielectric layers and the isolation dielectric layers at the sidewalls of the trenches, each trench having (i) a depth that extends along a first direction that is substantially normal to the planar surface, (ii) a length that extends along a second direction that is substantially parallel to the planar surface, (iii) a width that extends along a third direction that is substantially orthogonal to the depth and the length, the length of the trench being substantially greater than its width; and (2) dividing the multi-layers into a plurality of stacks of multi-layer strips, each stack being separated from an adjacent stack by the width of one of the trenches, with each multi-layer strip being the portion of a multi-layer between adjacent trenches; (c) filling the trenches with a dielectric filler material; (d) cutting a plurality of via openings in the dielectric filler material of each trench; (e) depositing into each via opening a charge-storage layer and a conductor; (f) cutting shafts at predetermined locations into each stack of multi-layer strips, thereby exposing the carbon layer of each multi-layer strip in each stack to the shaft; (g) through the shafts, in place of each carbon layer of each multi-layer strip, providing a third semiconductor layer of a second conductivity type.

The first semiconductor layer, the second semiconductor layer, the third semiconductor layer, the charge-storage layer and the conductor provide a bit line, a source line, a channel region, a charge-storage region and a gate electrode, respectively, of a storage transistor of the NOR memory string.

In addition, the process may further include a first sacrificial layer in the multi-layer which is in contact with the first semiconductor layer or the second semiconductor layer, which is replaced by a conductive material after the trenches are cut.

In some embodiments, providing the third semiconductor layer of a second conductivity type in place of each carbon layer of each multi-layer strip includes (a) removing each carbon layer by an ashing step that converts the carbon layers into carbon oxide gases, which are then expelled through the shafts, thereby creating a space in place of the carbon layers; and (b) depositing the third semiconductor layer into the space. The third semiconductor layer may be a conformal polysilicon liner.

The present invention is better understood upon consideration of the detailed description below in conjunction with the drawings.

BRIEF DESCRIPTION OF THE DRAWINGS

FIGS. 1(a), 1(b), 1(c), 1(d), 1(e), 1(f), 1(g), 1(h), 1(i), 1(j), 1(k), 1(l), 1(m), 1(n) and 1(o) illustrate a first process for fabricating an HNOR memory string, according to one embodiment of the present invention.

FIGS. 2(a), 2(b), 2(c), 2(d), 2(e), 2(f), 2(g), 2(h), 2(i), 2(j), 2(k), 2(l), 2(m), 2(n) and 2(o) illustrate a first process for fabricating an HNOR memory string, according to one embodiment of the present invention.

DETAILED DESCRIPTION OF THE PREFERRED EMBODIMENTS

Figures 1A, 1B:
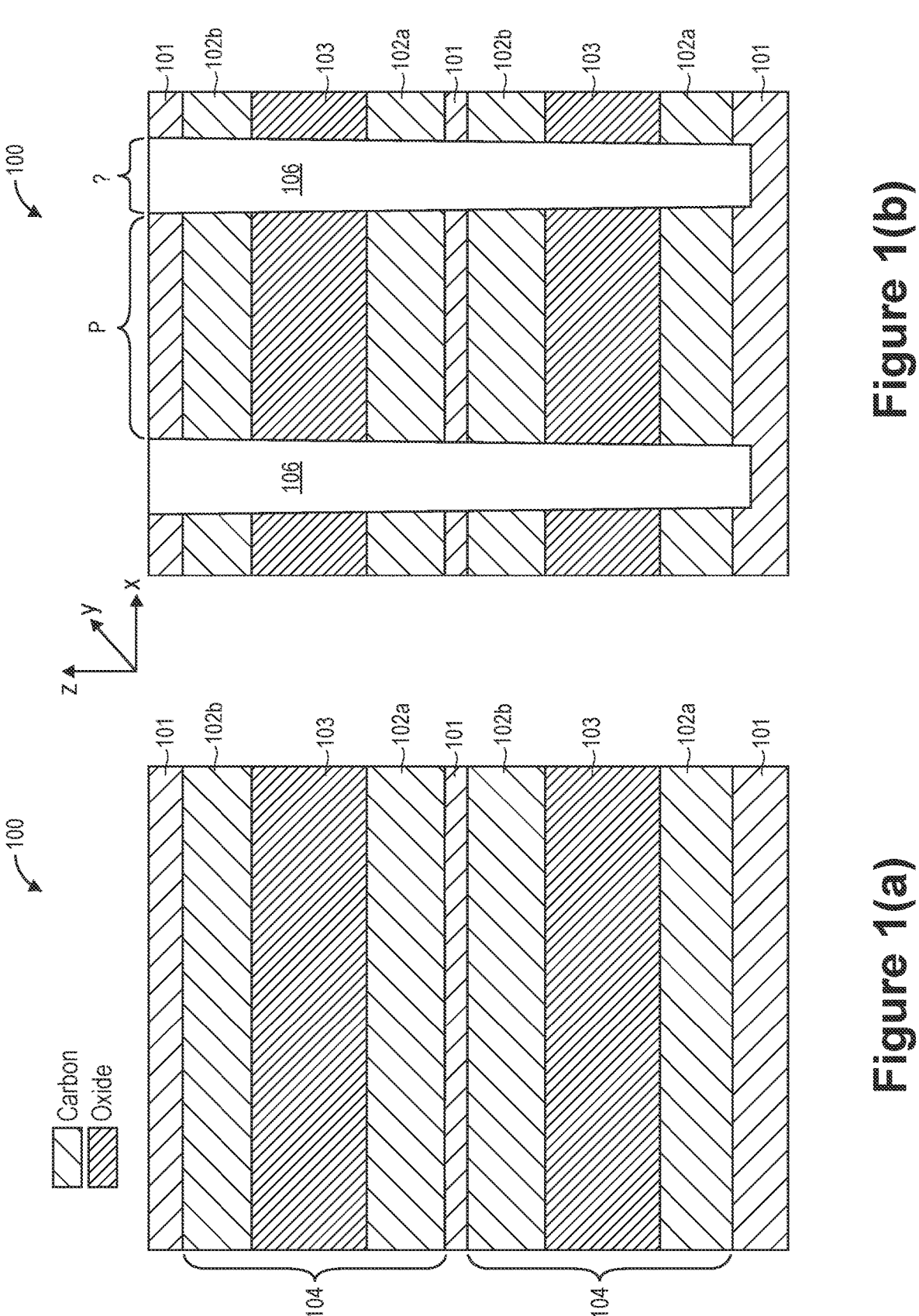
Figures 1C, 1D:
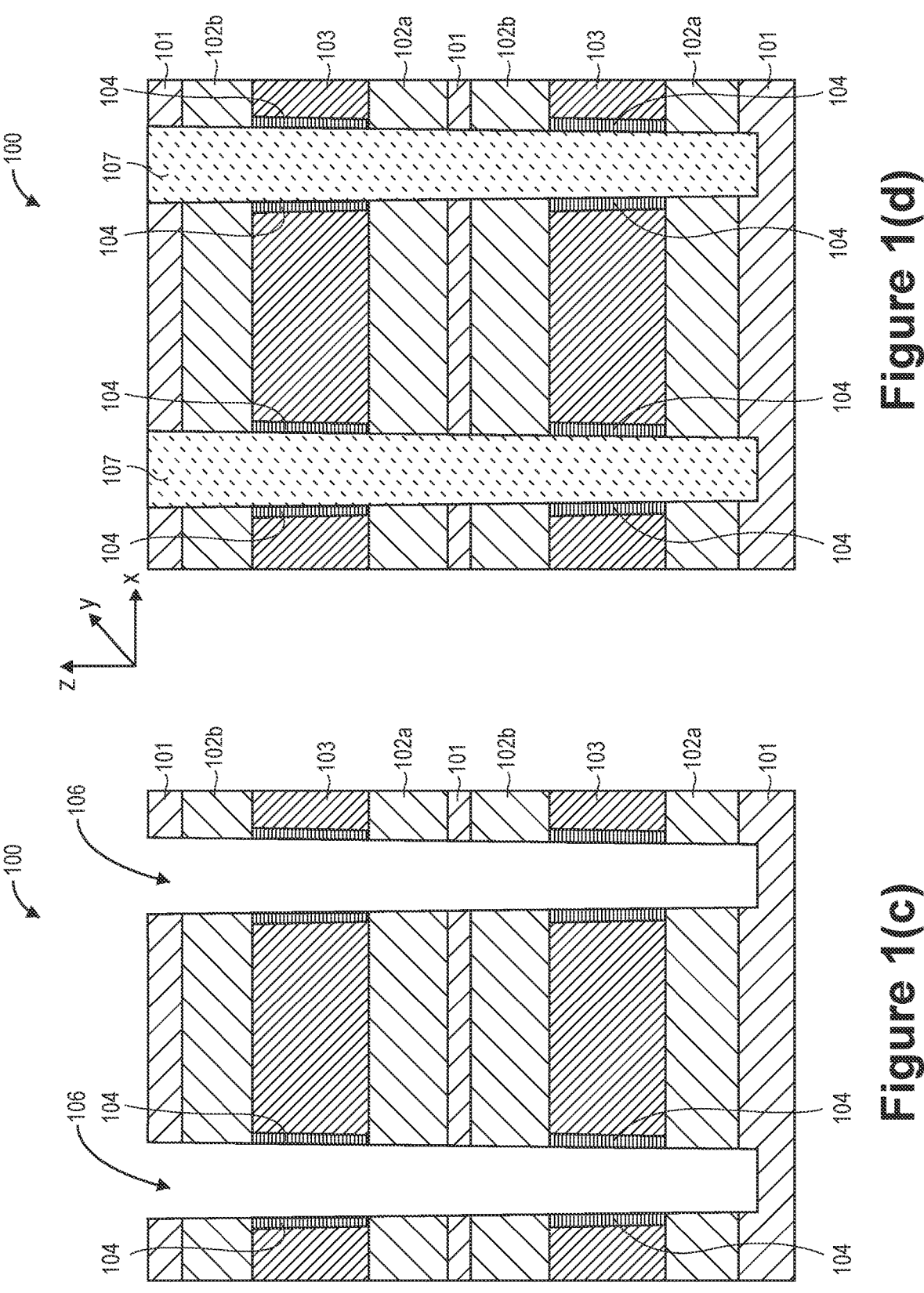
Figures 1E, 1F:
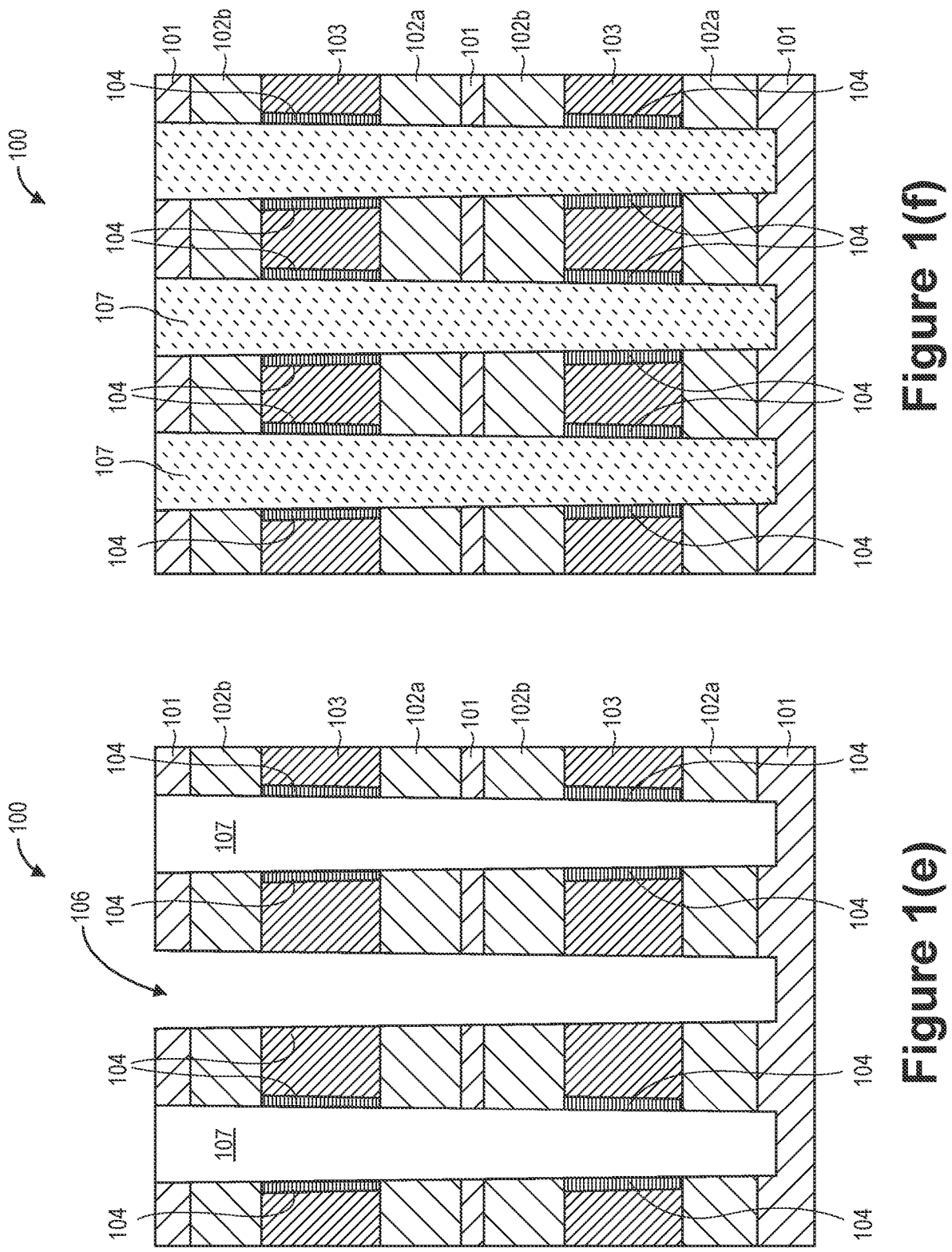
Figure 1G:
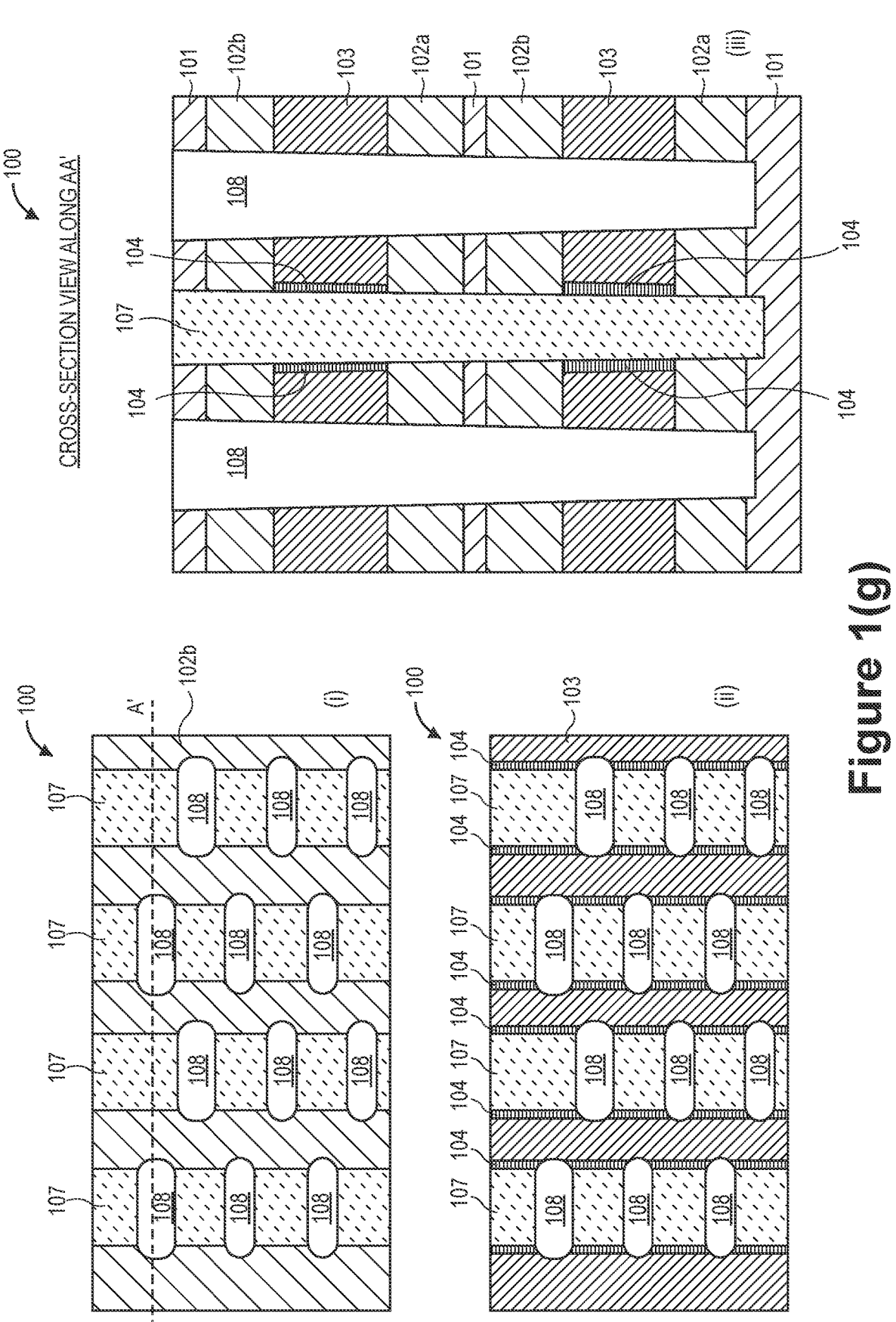
Figure 1H:
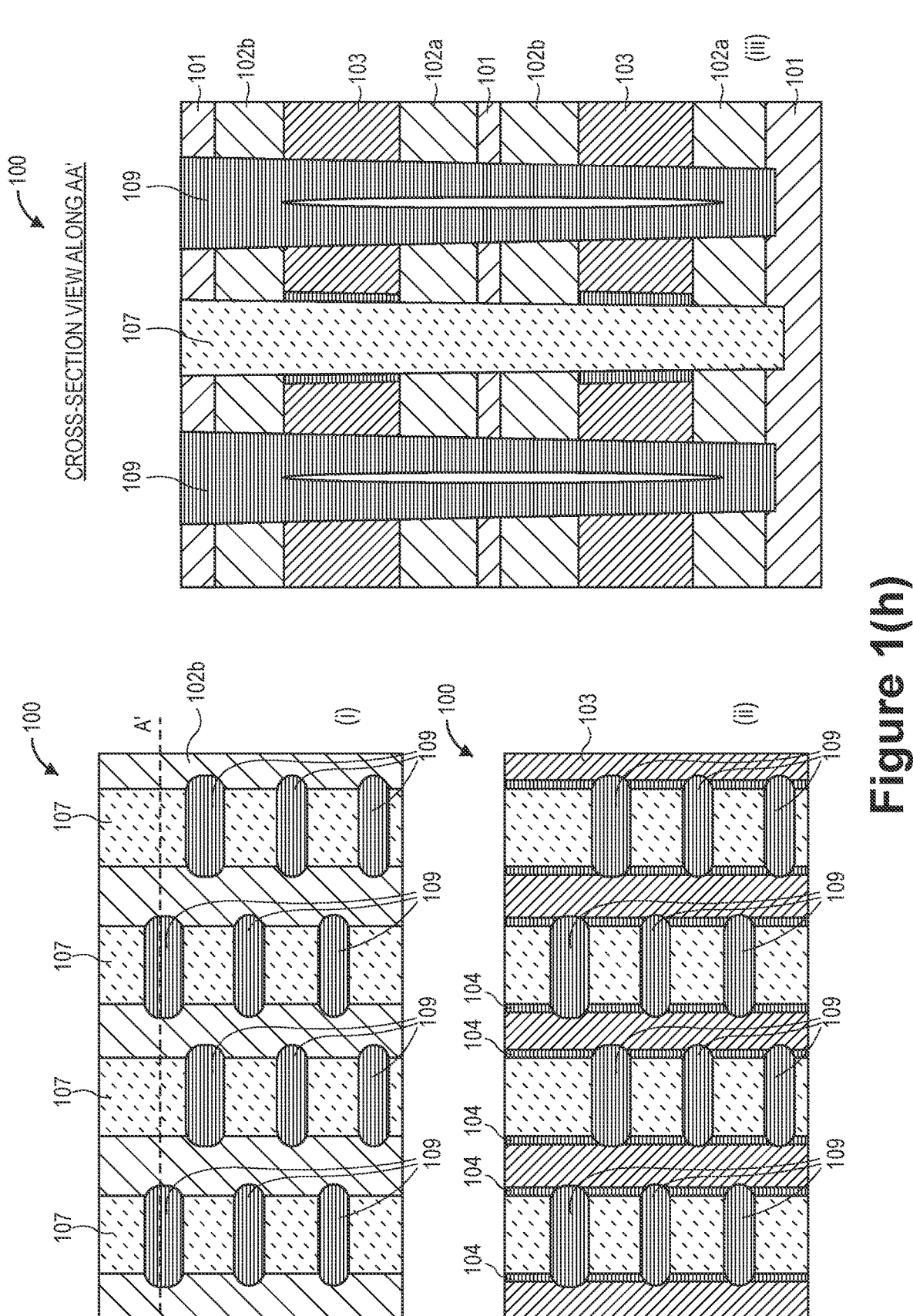
Figure 1I:
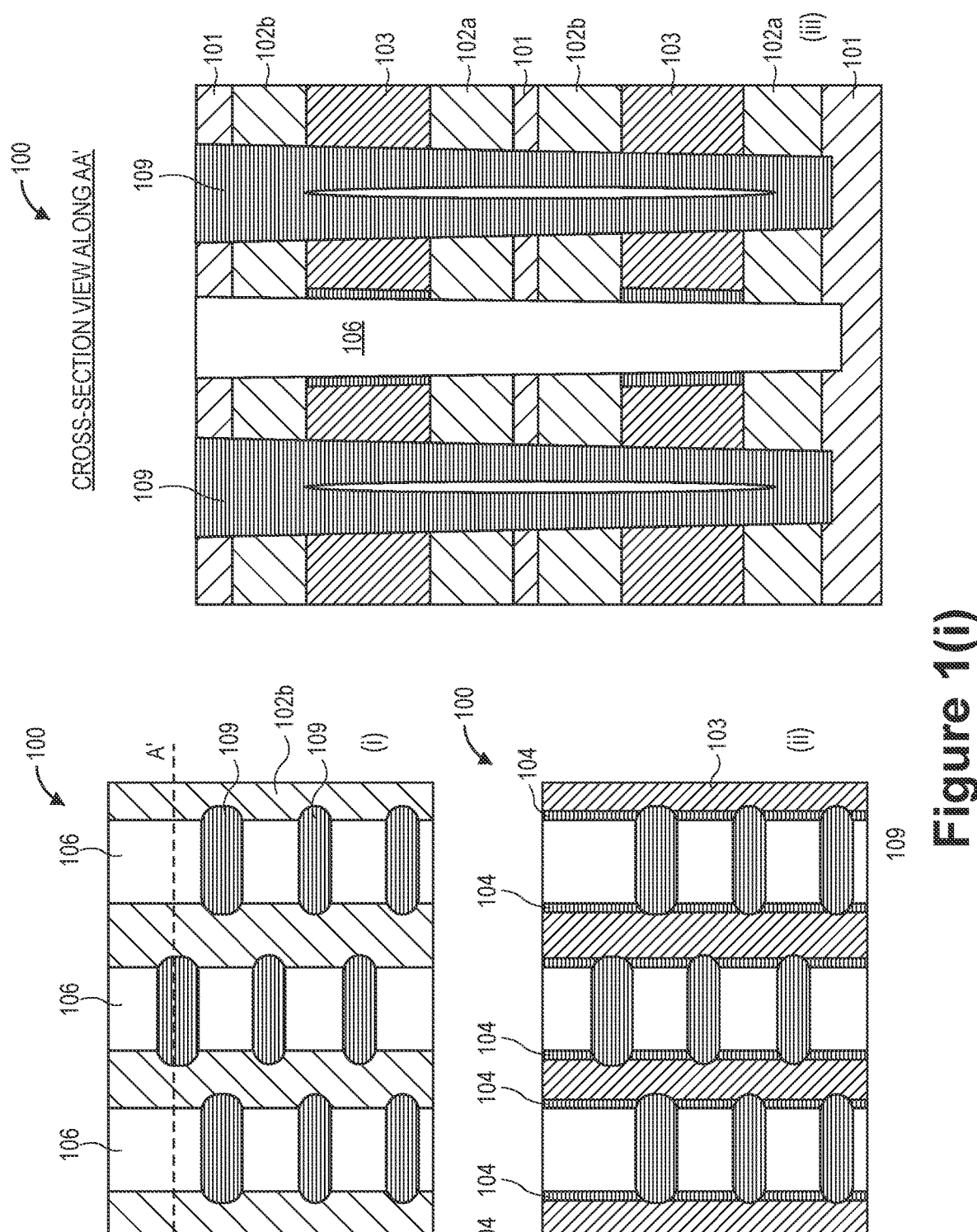
Figure 1J:
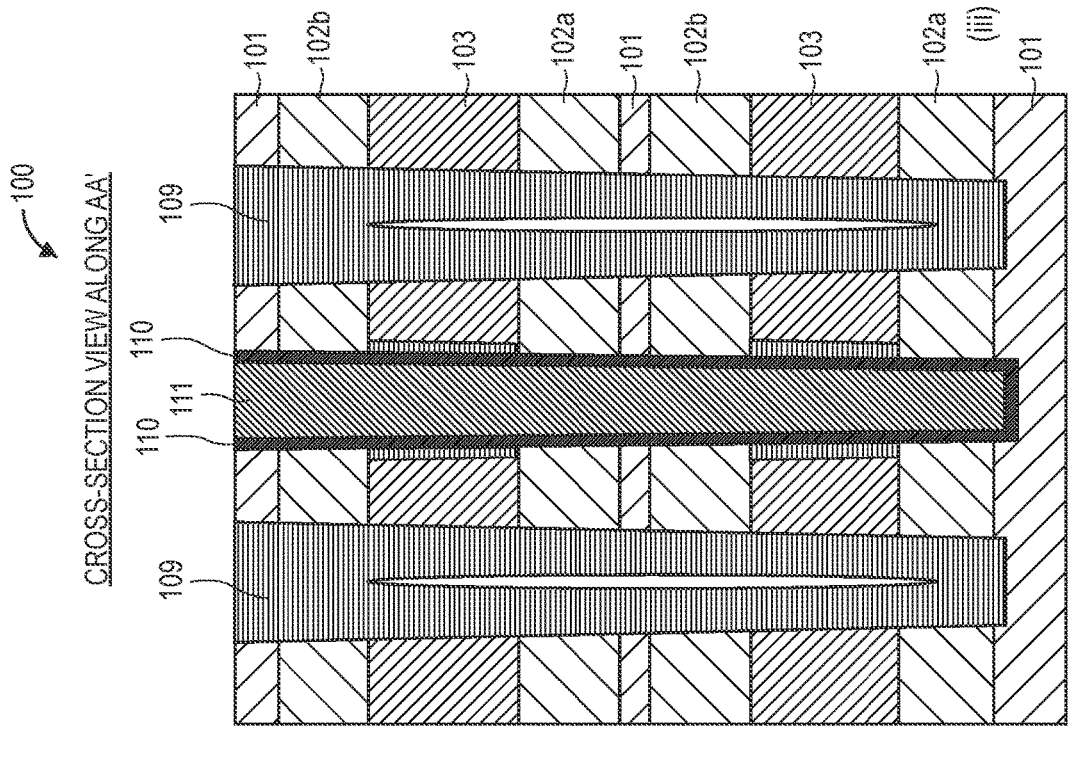
Figure 1J:
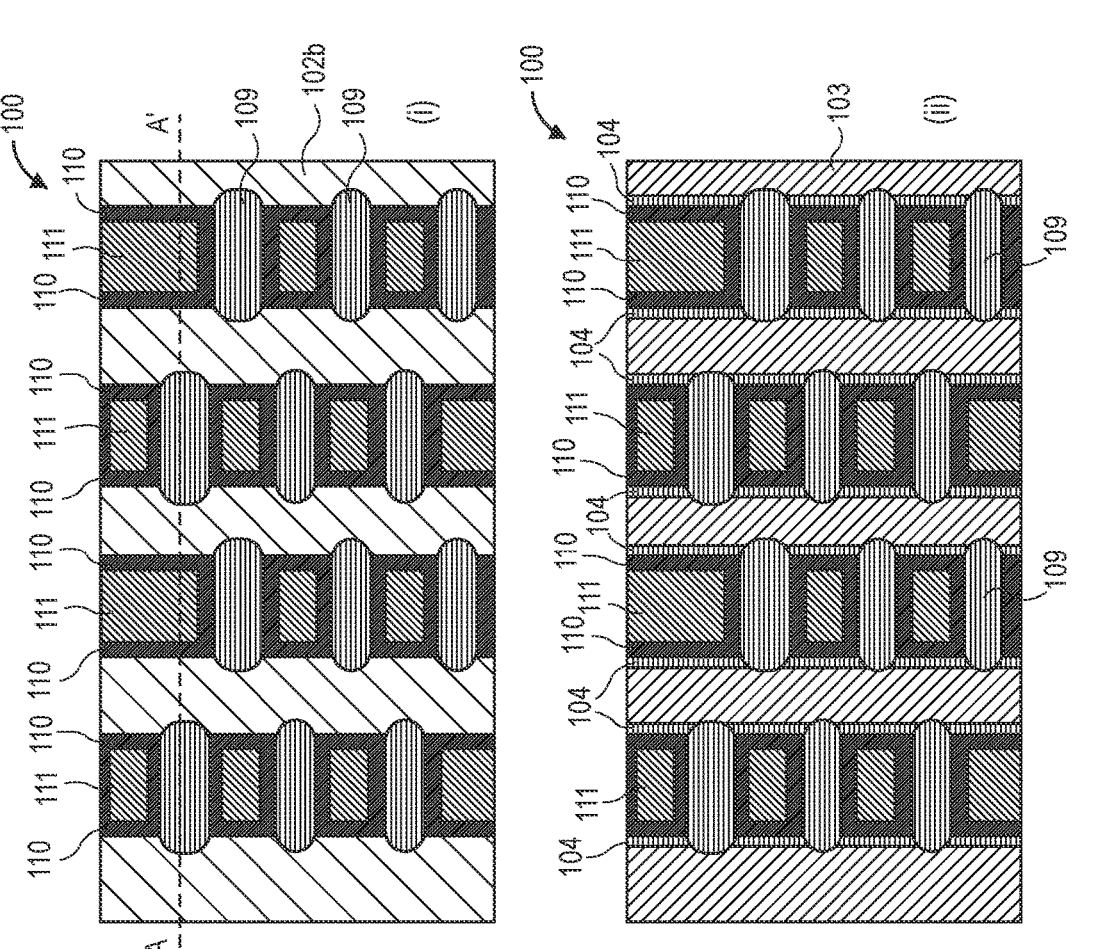
Figure 1K:
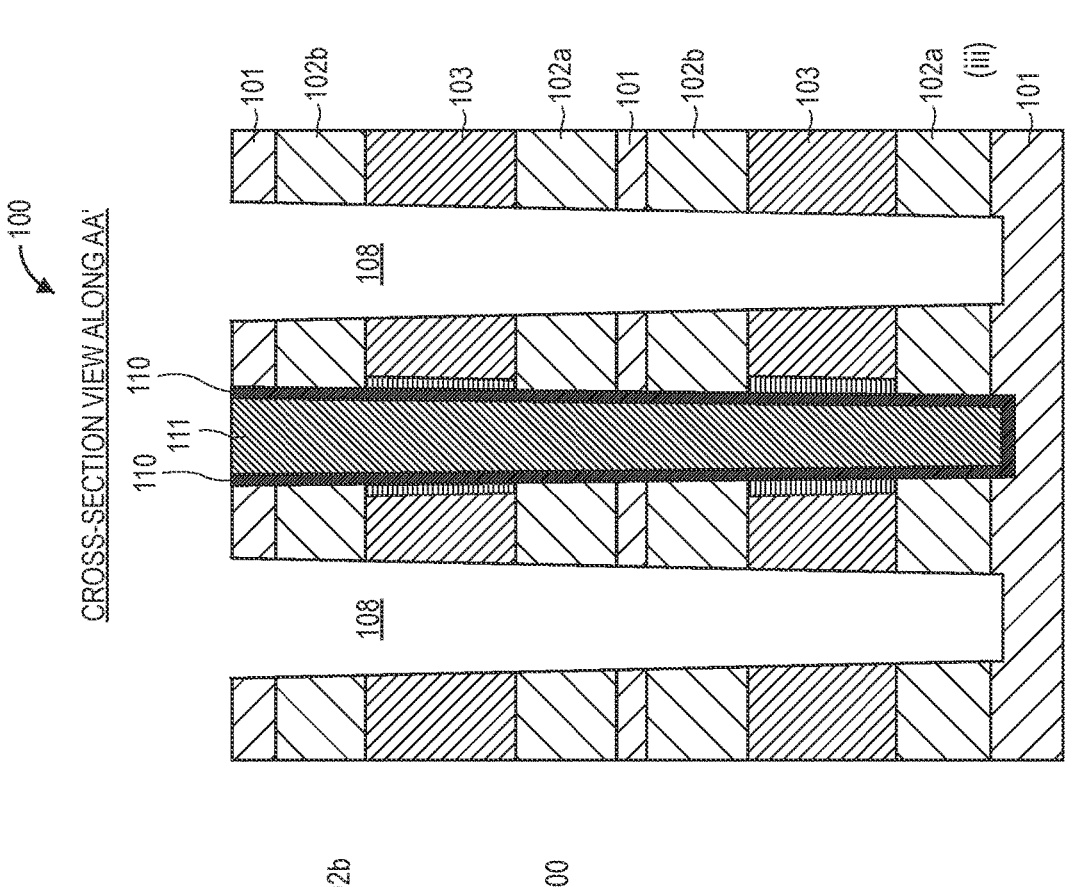
Figure 1K:
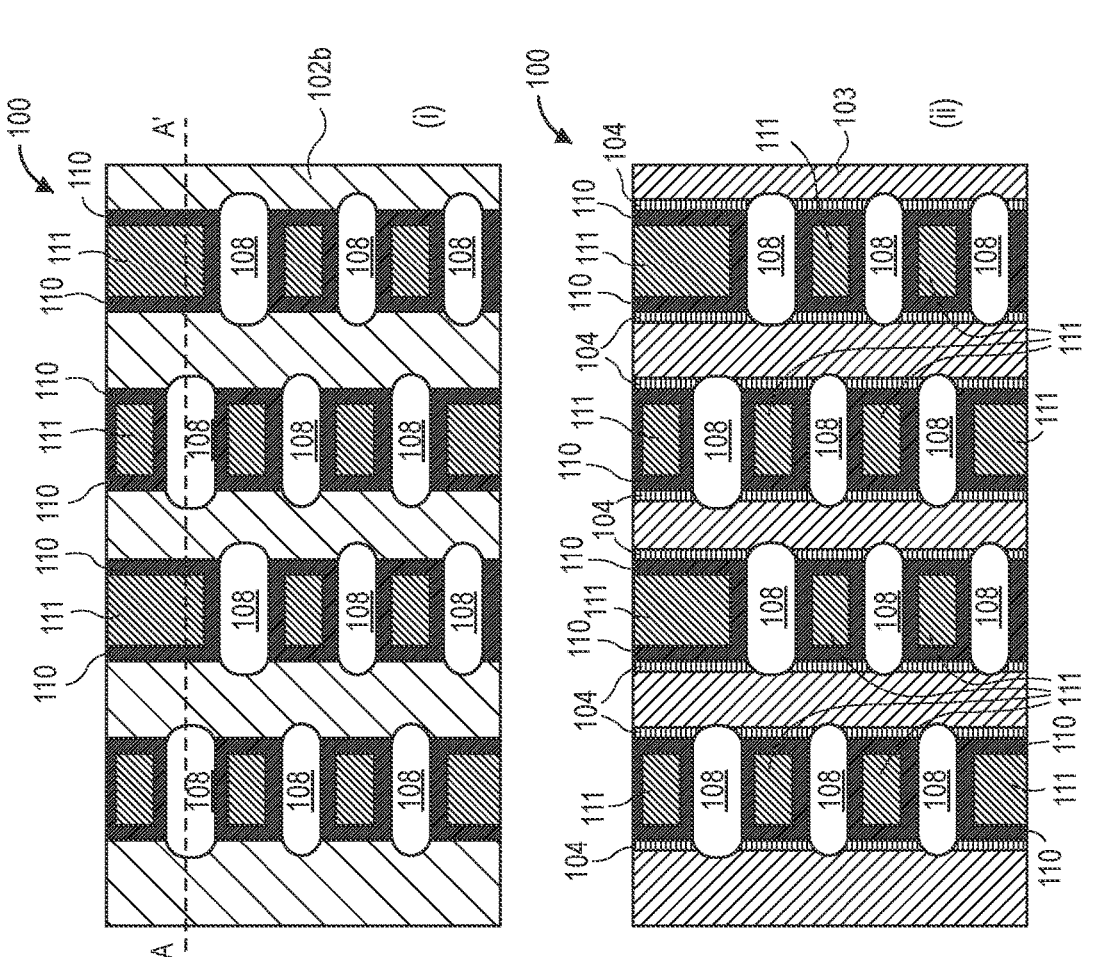
Figure 1I:
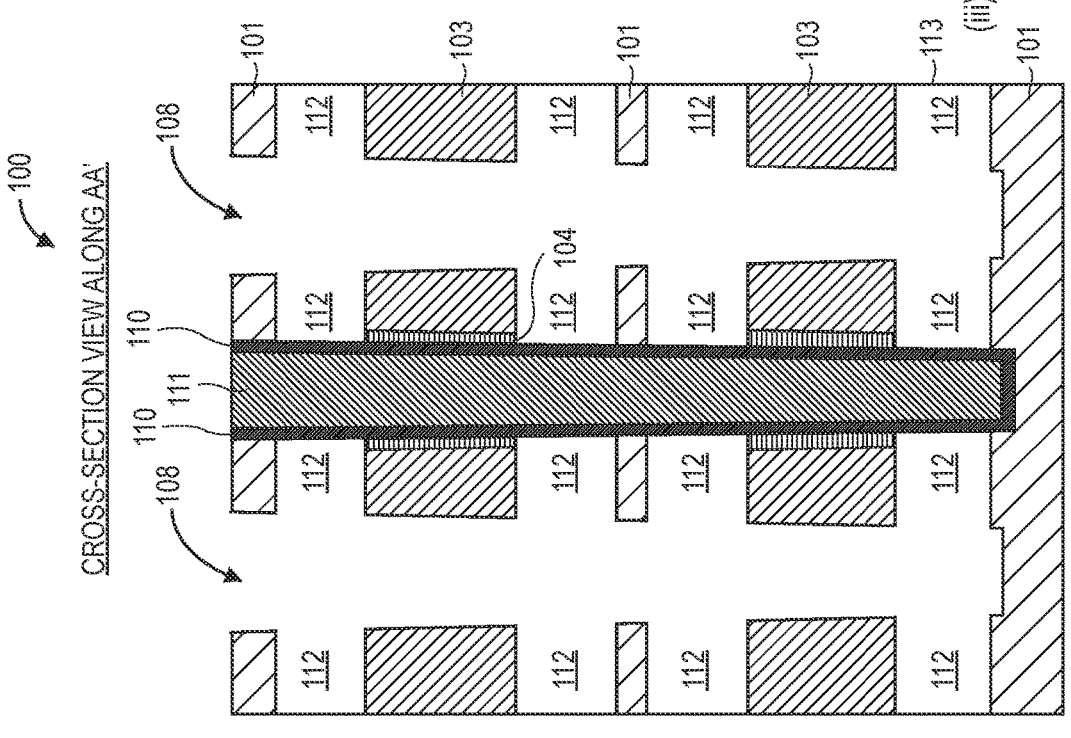
Figure 1I:
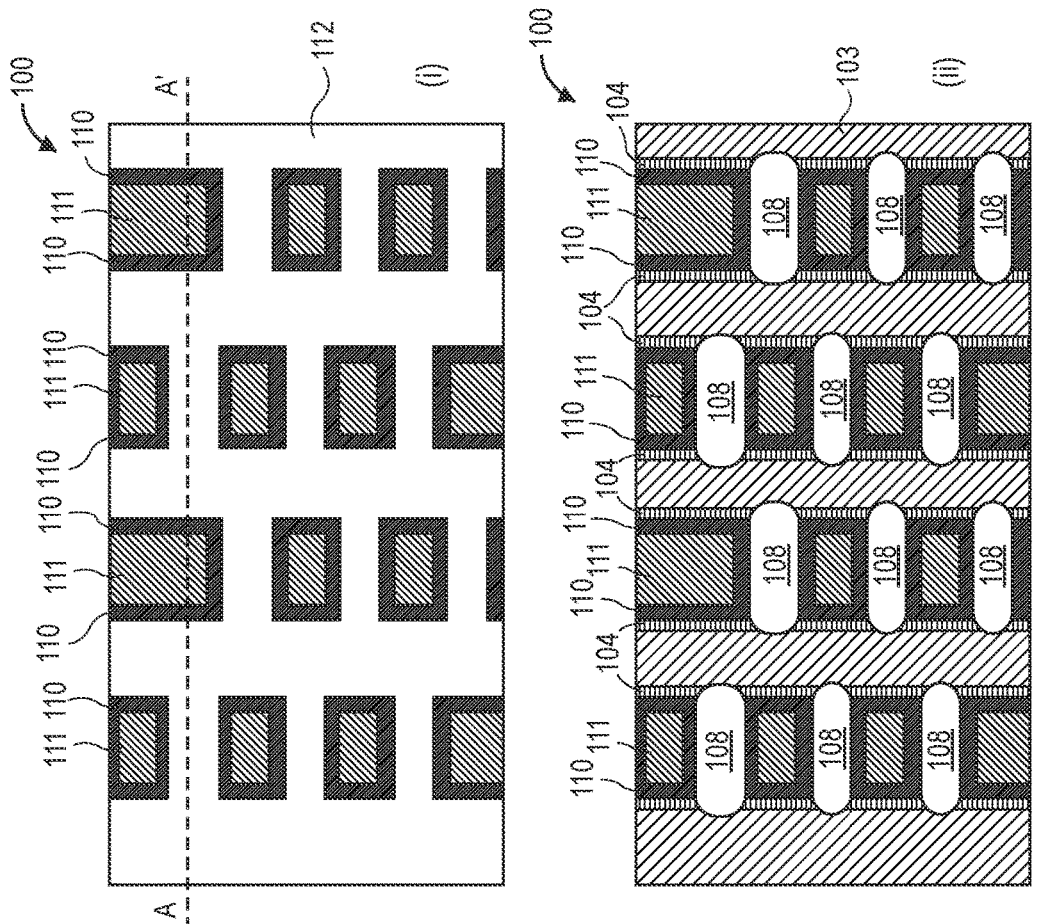
Figure 1M:
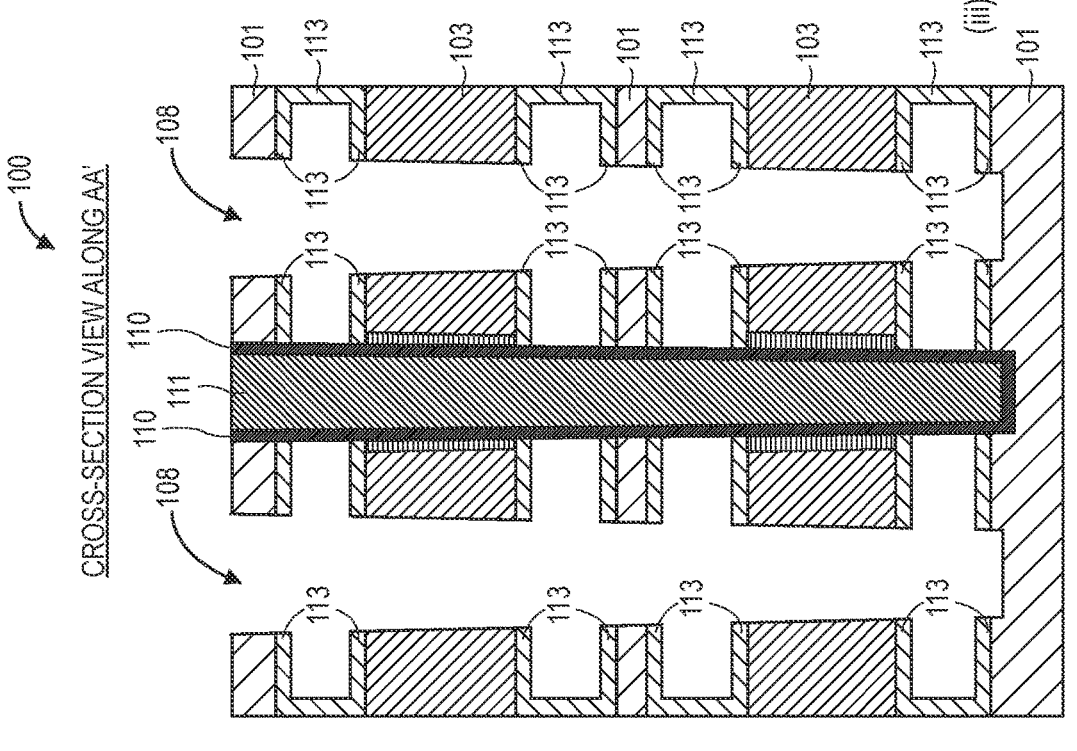
Figure 1M:
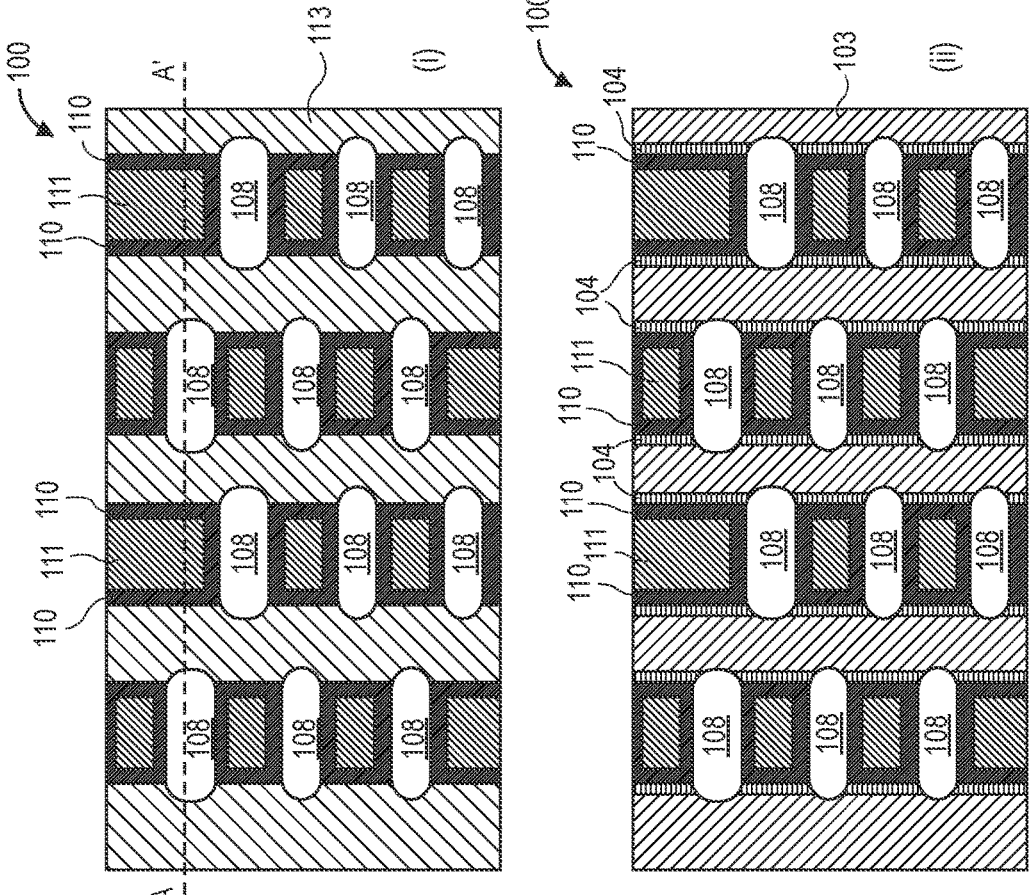
Figure 1N:
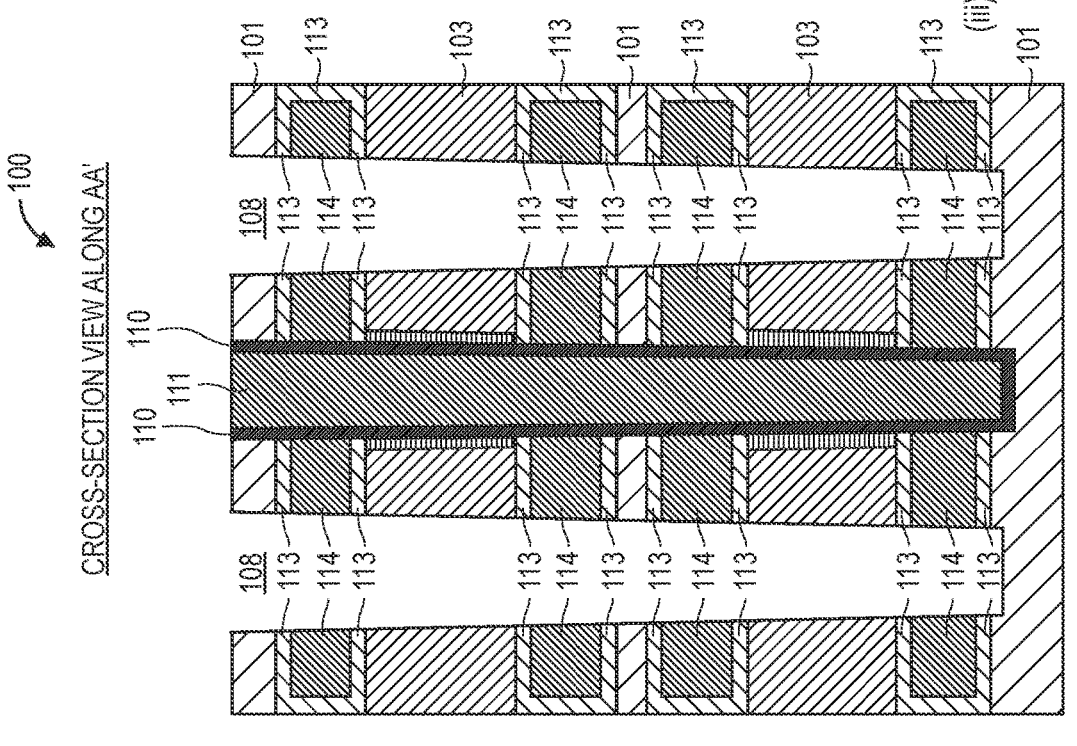
Figure 1N:
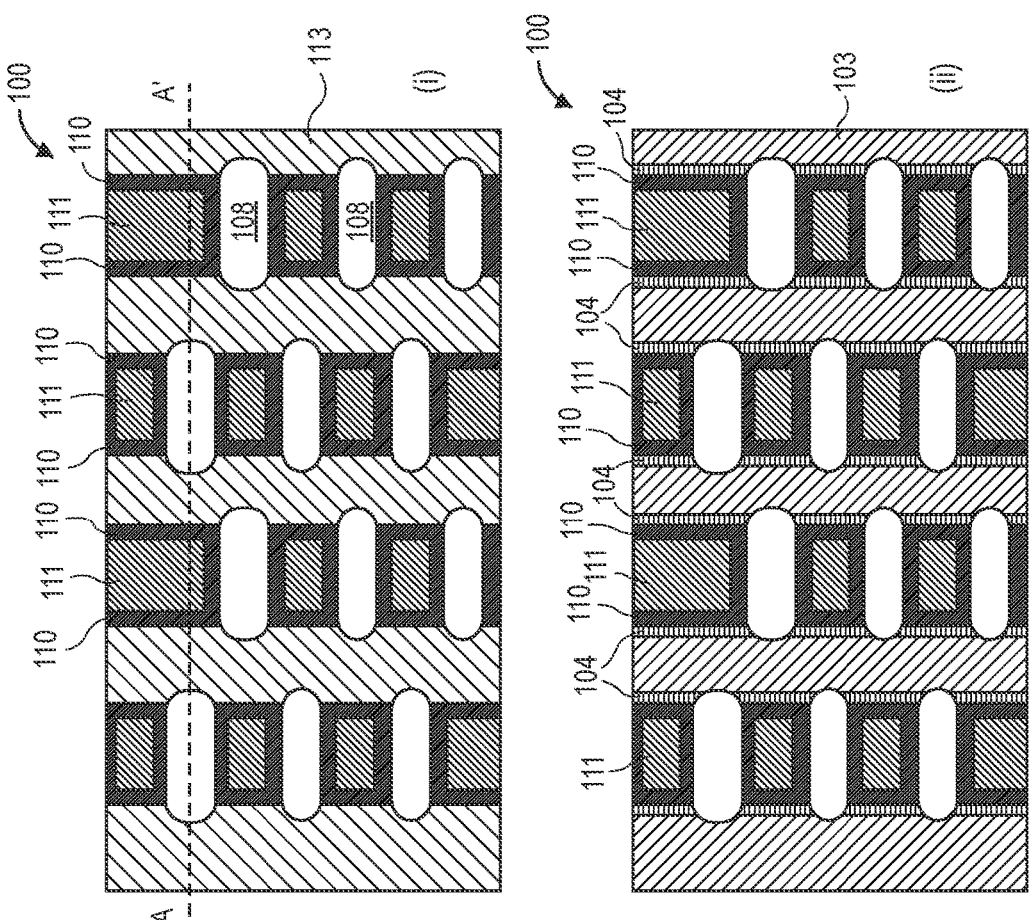
Figure 1O:
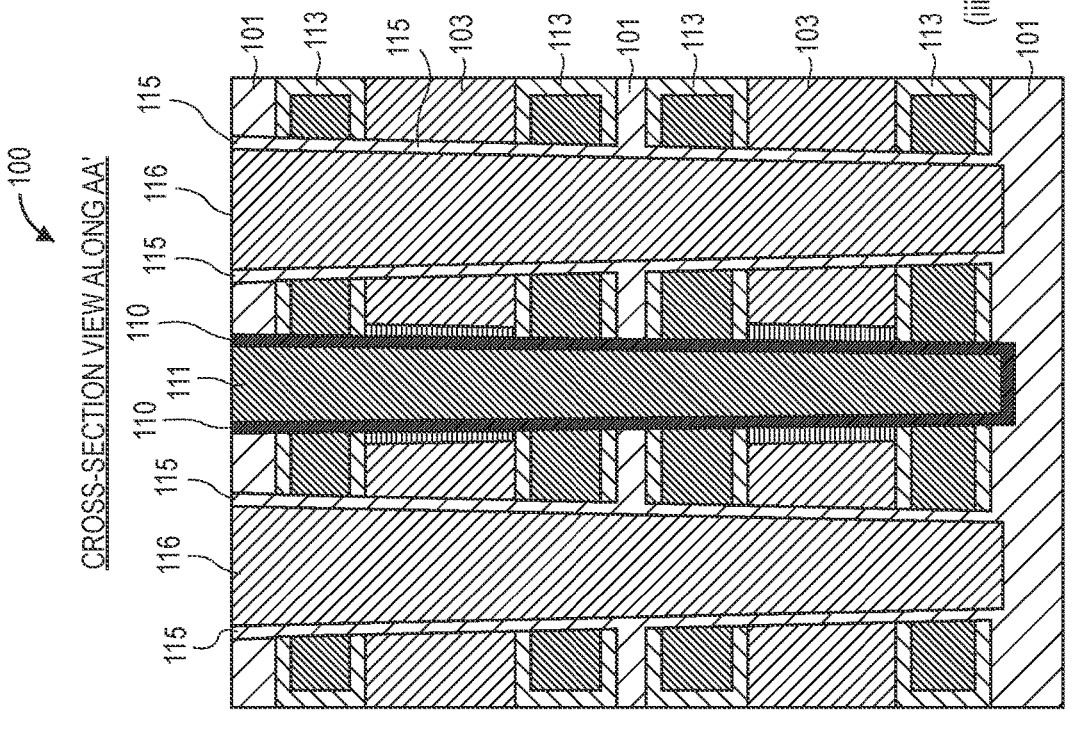
Figure 1O:
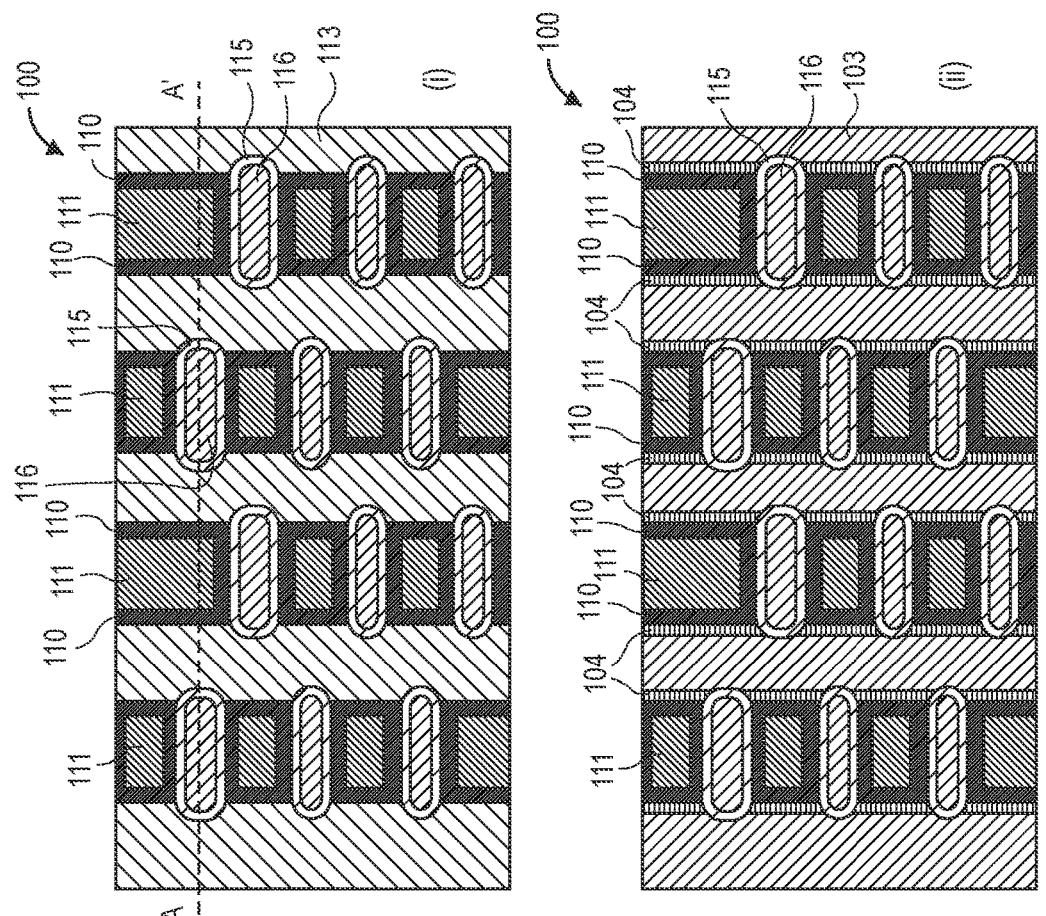

The present invention provides significantly more advantageous processes for fabricating HNOR memory strings than previously disclosed. For example, FIGS. 1(a) to 1(o) illustrate a first process for fabricating an HNOR memory string without the need for a custom-designed "4-color strata" reaction chamber, according to one embodiment of the present invention. To facilitate reference to the figures, a Cartesian coordinate reference frame is used, in which the Z-direction is normal to the planar surface of the semiconductor surface and the X-direction and the Y-directions are orthogonal to the Z-direction and to each other.

Initially, as shown in FIG. 1(a), memory structure 100 is formed by successive depositions of (i) isolation dielectric layer 101 and (ii) multilayer 104, which comprises (a) first carbon layer 102a, (b) dielectric layer 103, and (c) second carbon layer 102b. When isolation dielectric layer 101 and dielectric layer 103 are provided by compatible dielectric materials of different etch characteristics (e.g., both of the family of silicon oxides, such as SiOC and $SiO_2$), the successive depositions of the thin films can be very effectively and easily handled in an existing 2-color reaction chamber. Carbon layers 102a and 102b each may be deposited, for example, by chemical vapor deposition at 650° C., at 1.0 Torr. Isolation dielectric layer 101 may be, for example, a 30-nm thick SiOC layer. Carbon layer 102a and 102b may be each, for example, 15 nm thick, dielectric layer 103 may be 40-nm thick silicon dioxide ($SiO_2$) or SiOC. Of course, the thicknesses and other dimensions disclosed herein are provided merely for illustrative purposes. In any implementation, any suitable variations may be adopted. For example, the thin films of FIG. 1(a) may each have a thickness that varies ±10 nm from the respective disclosed thickness above.

Note that carbon layers 102a and 102b are each much thinner than the semiconductor layers (e.g., the $n^+$ polysilicon layers) in the active layers disclosed in Related Application II. For example, the total thickness of the multilayer 104 and isolation dielectric layer 103 is approximately ⅔ the total thickness of the active layer and an adjacent isolation dielectric layer disclosed in Related Application II. The thinner carbon layers are possible because of their greater mechanical strength, as the carbon so deposited has a lattice structure in the cubic form, which provides it significantly greater mechanical strength than polysilicon. Because of the thinner carbon layers, significantly greater number of thin films may be provided in the memory structure without increasing the aspect ratios of the vertical etches. At this time, while the manufacturing processes of Provisional Applications II and III disclose memory structures having up to eight HNOR memory strings along the vertical direction, a process of the present invention using carbon layers 102a and 102b may support memory structures having 12 or more HNOR memory strings along the vertical direction.

Trenches 106 (e.g., 60 nm wide, 160 nm apart) are then cut in memory structure 100 using, for example, an anisotropic etch set up by a photo-lithographical patterning step. FIG. 1(b) shows resulting memory structure 100. Because of the thinner carbon layers, the aspect ratio of this anisotropic etch is reduced significantly form the corresponding etch of the active layers in Related Application II.

Thereafter, dielectric layer 103 is recessed (e.g., by 10 nm) using, for example, an isotropic etch, followed by a conformal deposition of an in situ-doped $p^-$ amorphous silicon or polysilicon layer. An anisotropic etch removes the amorphous silicon or polysilicon from the sidewalls of trenches 106 and the top of memory structure 100, leaving separated amorphous silicon or polysilicon layer 104 in the recesses of dielectric layer 103. Resulting memory structure 100 is shown in FIG. 1(c). Amorphous silicon or polysilicon layer 104 (e.g., 10 nm thick) are provided to subsequently form the channel regions. Trenches 106 are then filled by dielectric material 107 (e.g., $SiO_2$). Excess dielectric material may be removed from the top of memory structure 100 using, for example, a chemical-mechanical polishing (CMP) step. Resulting memory structure 100 is shown in FIG. 1(d).

With the mechanical support from dielectric material 107 in the first set of trenches 106, second set of trenches 106, each also approximately 60 nm wide. are then cut using substantially the same technique as illustrated in conjunction with FIG. 1(b) above. Resulting memory structure 100 is shown in FIG. 1(e). Each of the second set of trenches 106 is cut substantially equidistant between an adjacent pair of the first set trenches 106, such that the resulting stacks are each approximately 40 nm wide. Dielectric layer 103 exposed in the second set of trenches 106 is then recessed using, for example, substantially the same technique as discussed above in conjunction with FIG. 1(*b*) and followed by a conformal deposition of an in situ-doped p$^-$ amorphous silicon or polysilicon layer using substantially the same technique as illustrated above in conjunction with FIG. 1(*c*). Likewise, an anisotropic etch removes the amorphous silicon or polysilicon from the sidewalls of trenches 106 and the top of memory structure 100, leaving separated amorphous silicon or polysilicon layer 104. Thereafter, the second set of trenches 106 are filled with dielectric material 107, substantially as illustrated above in conjunction with FIG. 1(*d*). Resulting memory structure 100 is shown in FIG. 1(*f*). As discussed above, the relatively thinner carbon layers 102*a* and 102*b* significantly reduced the aspect ratios of anisotropic etches that form the first and the second sets of trenches 106, such that it may be possible to perform all the trench and channel region formations, filling of dielectric material 107 steps and subsequent CMP steps only once rather than twice: first in the steps of FIGS. 1(*e*) to 1(*f*), and second in the corresponding steps of FIGS. 1(*b*) to 1(*d*).

Thereafter, as shown in FIG. 1(*g*), vias 108 are patterned and cut in dielectric material 107 using, for example, an anisotropic etch. Vias 108 may be oval in horizontal cross-section, having a major axis of 100 nm along the X-direction and a minor axis of 60 nm along the Y-direction. Vias 108 are filled at a later time by a dielectric material so as to isolate adjacent storage transistors that are to be formed in an HNOR memory string. FIGS. 1(*g*) to 1(*o*)—which illustrate the remainder of the fabrication process steps according to the embodiment of the present invention illustrated in conjunction with FIGS. 1(*a*) to 1(*f*)—each include three views. View (i) is a horizontal cross-section (i.e., in an X-Y plane) through carbon layer 102*a*, view (ii) is a horizontal cross-section through dielectric layer 103, and view (iii) is a vertical cross-section (i.e., in an X-Z plane) along line A-A' of view (i).

Vias 108 are then filled with sacrificial amorphous silicon material 109, as shown in FIG. 1(*h*). Excess amorphous silicon on top of memory structure 100 may be removed using, for example, CMP. FIG. 1(*h*) illustrates resulting memory structure 100. The remainder of dielectric material 107 in trenches 106 is then removed using, for example, a wet etch step, as illustrated in FIG. 1(*i*).

Charge-storage layer 110 is then conformally deposited on the exposed sidewalls of trenches 106. In this embodiment, charge-storage ("OZNOA") layer 110 may be a multi-layer that includes, for example, (i) a 1-nm thick tunneling dielectric layer (e.g., silicon oxide ($SiO_2$)); (ii) a 6-nm thick charge-trapping multilayer that includes zirconium oxide (ZrO), silicon nitride (SiN) and $SiO_2$; and (iii) a 3-nm thick blocking layer (e.g., $Al_2O_3$). (These dimensions are provided merely for illustrative purposes; any suitable thicknesses or dimensions may be used.) As known to those of ordinary skill in the art, each of these materials need not be the stoichiometric compounds. For example, the silicon nitride in the charge-trapping layer may be silicon-rich nitride. Thereafter, trenches 106 are filled by conductive layer 111, which may include successively deposited titanium nitride (TiN) liner and tungsten (W). The TiN liner may be formed using, for example, an atomic layer deposition (ALD) technique. In each of trenches 106, between adjacent vias 108 (now filled by sacrificial amorphous material 109), conductive layer 111 provides a vertical local word line that serves as gate electrode for each of the storage transistors that are vertically aligned in the same active stack. Excess deposited materials may be removed from the top of memory structure 100 by CMP. FIG. 1(*j*) illustrate resulting memory structure 100.

Sacrificial amorphous silicon material 109 is then removed from vias 108 using, for example, a wet etch step. FIG. 1(*k*) illustrates resulting memory structure 100. Carbon layers 102*a* and 102*b* may then be removed and evacuated as a carbon oxide gas in an ashing step (e.g., 275° C., dry oxygen ($O_2$) ambient), leaving cavities 112. The ashing step has the advantage that it does not damage p$^-$ polysilicon layer 104 (i.e., the channel regions). In general, being amenable to removal by ashing is a significant advantage that carbon has over other sacrificial materials, as the input reactant gases (e.g., oxygen) are readily available and safe to handle, and the resulting and byproduct gases (e.g., $CO_2$) can also be easily handled and disposed, unlike the reactants of common wet etches, for example, which may include toxic, hazardous, or noxious chemicals or gases. FIG. 1(*l*) illustrates resulting memory structure 100.

Thereafter, phosphorus-doped n$^+$ polysilicon liner 113 (e.g., 20 nm thick) is then conformally deposited in cavities 112, as illustrated in FIG. 1(*m*). Phosphorus-doped n$^+$ polysilicon liner 113 provides the common source line and the common bit line for storage transistors in the HNOR memory strings to be formed. An etch-back step using, for example, a wet etch may then be carried out to remove the portions of n$^+$ polysilicon liner 113 outside of cavities 112 (e.g., from the vertical sidewalls of trenches 106), As phosphorus-doped n$^+$ polysilicon liner 113 are deposited at this late stage of the fabrication process, thermal diffusion into the channel regions (i.e., p$^-$ polysilicon layer 104) is avoided, as no further high temperature process steps are expected. Thus, phosphorus, which has less onerous handling requirements than other n-type dopants, such as arsenic, may be used. FIG. 1(*m*) illustrates resulting memory structure 100.

Cavities 112 are then filled by deposition of conductive layer 114 over n$^+$ polysilicon liner 113. Conductive layer 114 which includes successively deposited titanium nitride (TiN) liner and tungsten (W). The TiN liner may be formed using, for example, an atomic layer deposition (ALD) technique. Excess deposited materials may be removed from the sidewalls of trenches 106 and from the top of memory structure 100 using, for example, an anisotropic etch, followed by CMP. Conductive layer 114 reduces the resistivity encountered by a signal imposed on the common source line or the common bit line conductive layer 114 contacts. FIG. 1(*n*) illustrates resulting memory structure 100.

Conductive layer 114 may then be recessed from vias 108 using, for example, any suitable etching step (e.g., a wet etch). Thereafter, SiOC liner layer 115 may be deposited to provide electrical isolation between adjacent storage transistors in the HNOR memory strings. The remainder of vias 108 may be filled with a dielectric material (dielectric material 116; e.g., $SiO_2$). FIG. 1(*o*) illustrates resulting memory structure 100.

Alternative, FIGS. 2(*a*) to 2(*n*) show a second process for fabricating HNOR memory strings that simplifies formation of the channel regions, according to one embodiment of the present invention. In a previous disclosed process, the channel regions are formed by depositing p$^-$ polysilicon into recesses formed by etching a sacrificial dielectric material provided between the common source line and the common bit line laterally (e.g., along the Y-direction). The process of FIGS. 2(*a*) to 2(*n*) take advantage of the significant advantages of using carbon as a sacrificial material, as discussed above.

Figure 2B:
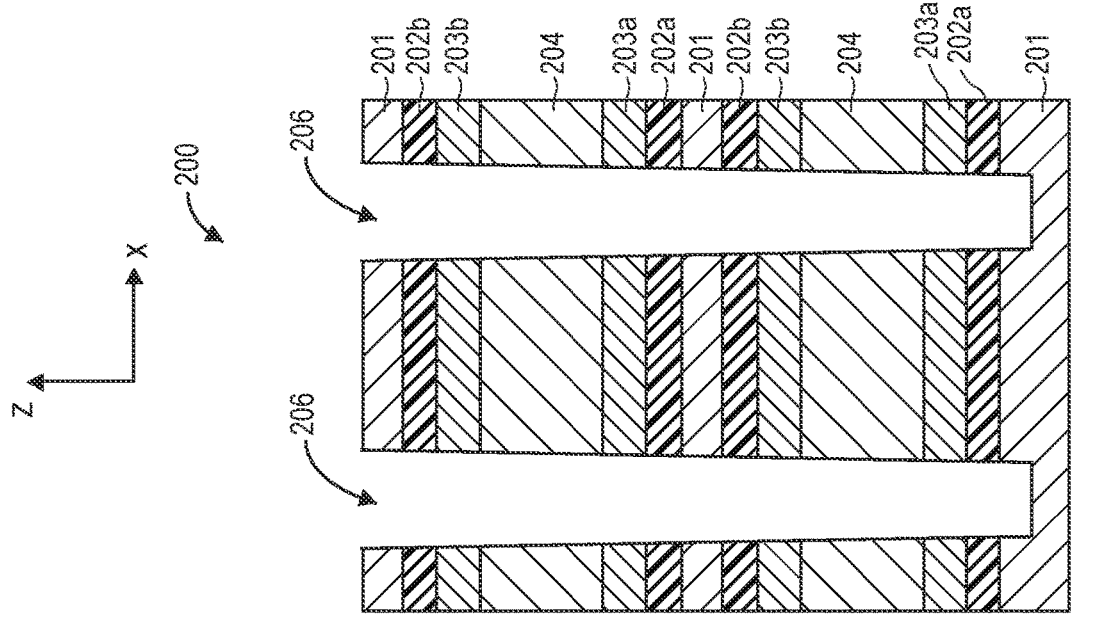
Figure 2A:
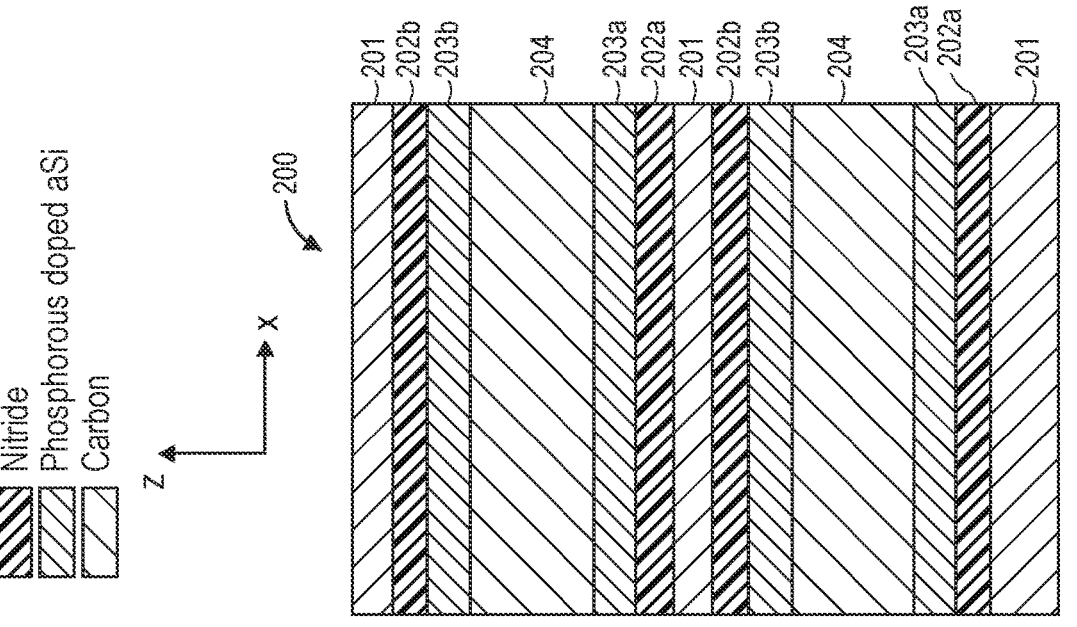

Initially, as shown in FIG. 2(a), memory structure 200 is formed by successive depositions of (i) isolation dielectric layer 201 and (ii) multilayer 204, which includes (a) first silicon nitride layer 202a, (b) first phosphorus-doped amorphous silicon layer 203a, (c) carbon layer 204, (d) second phosphorus-doped amorphous silicon layer 203b, and (e) second silicon nitride layer 202b. Isolation dielectric layer 201 may be, for example, a 30-nm thick SiOC layer. First and second silicon nitride layers 202a and 202b each may be 30 nm thick, and first and second phosphorus-doped amorphous silicon layers 203a and 203b each may be 40 nm thick and carbon layer 204 may be, for example, also 40 nm thick. (These dimensions are provided merely for illustrative purposes; any suitable thicknesses or dimensions may be used.) Carbon layer 204 may be deposited, for example, by chemical vapor deposition at 650° C., at 1.0 Torr. FIG. 2(a) shows memory structure 200 after the depositions of the initial layers of thin films. Multi-layer 204 is also referred in this detailed description as an "active layer."

Figure 2D:
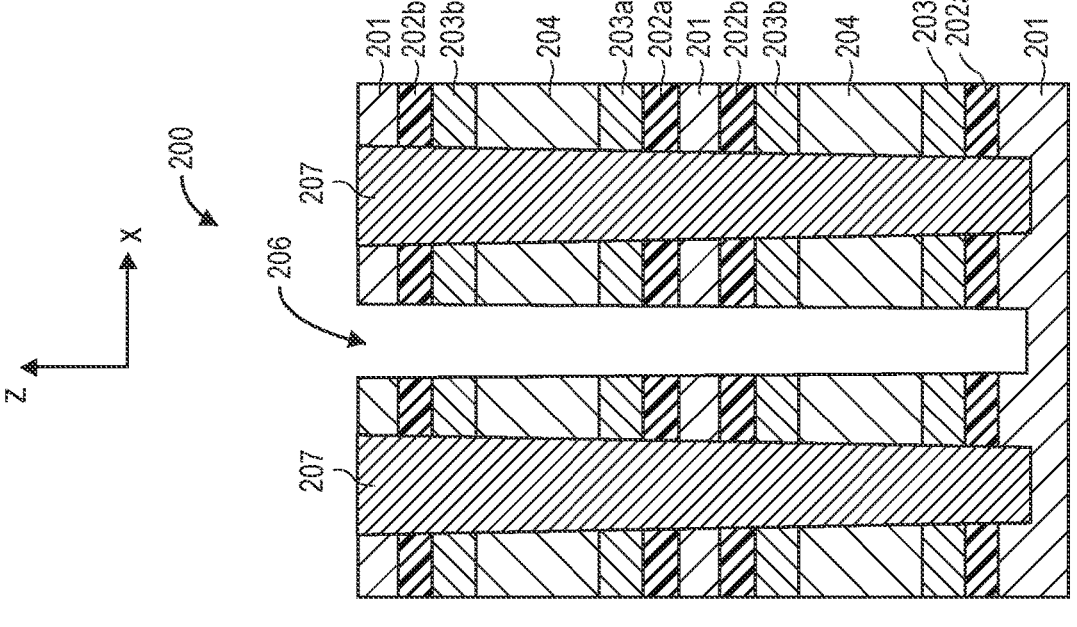
Figure 2C:
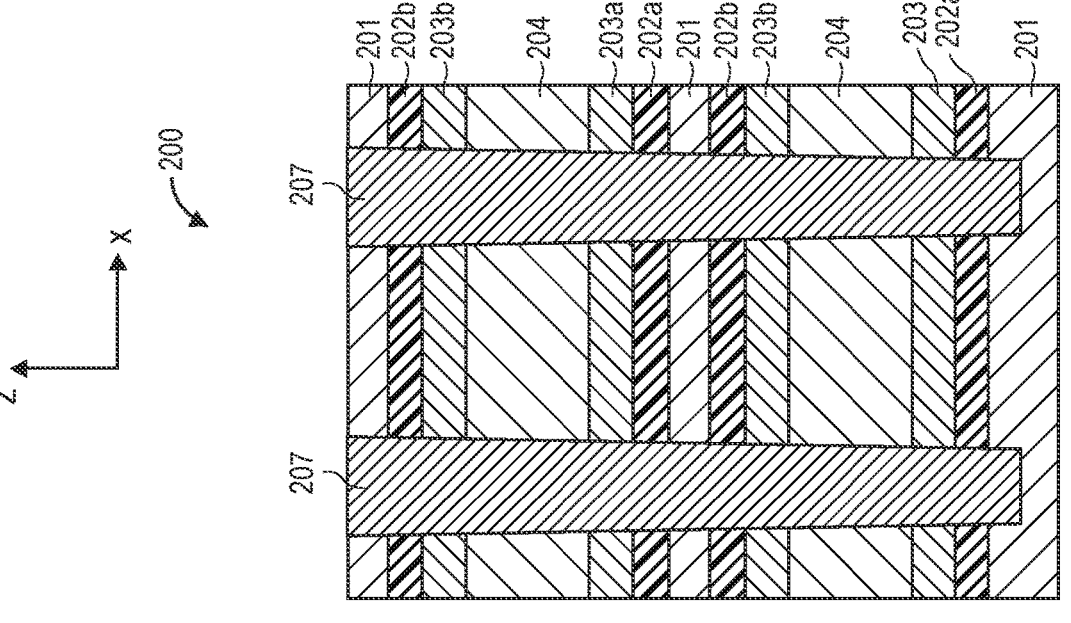

Trenches 206 (e.g., 60 nm wide, 160 nm apart) are then formed in memory structure 200 using, for example, an anisotropic etch after a photo-lithographical patterning step. FIG. 2(b) shows resulting memory structure 100. Trenches 206 are then filled by dielectric material 207 (e.g., $SiO_2$). Excess dielectric material may be removed from the top of memory structure 100 using, for example, CMP. Resulting memory structure 100 is shown in FIG. 2(c).

With the mechanical support from dielectric material 207, second set of trenches 206, each also approximately 60 nm wide, are then cut using substantially the same technique as discussed in conjunction with FIG. 2(b) above. Resulting memory structure 100 is shown in FIG. 2(d). Each of the second set of trenches 206 is cut between an adjacent pair of the first set of trenches 106, such that the resulting stacks—also referred to herein as "active stacks"—are each approximately 40 nm wide. The resulting narrow strips resulting from the active layers are also referred herein as "active strips."

Figure 2F:
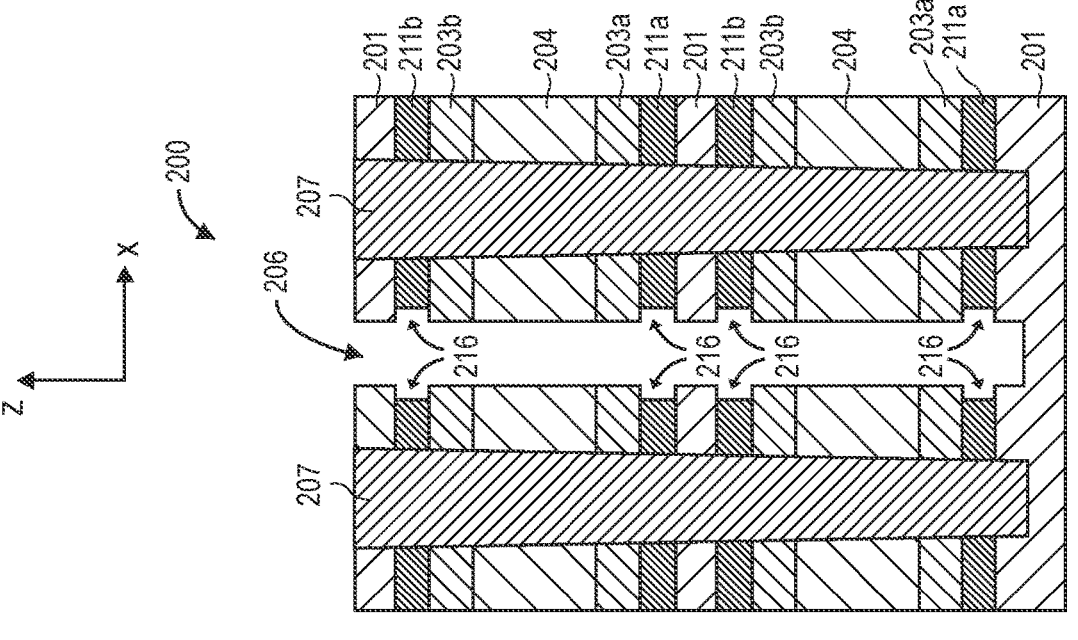
Figure 2E:
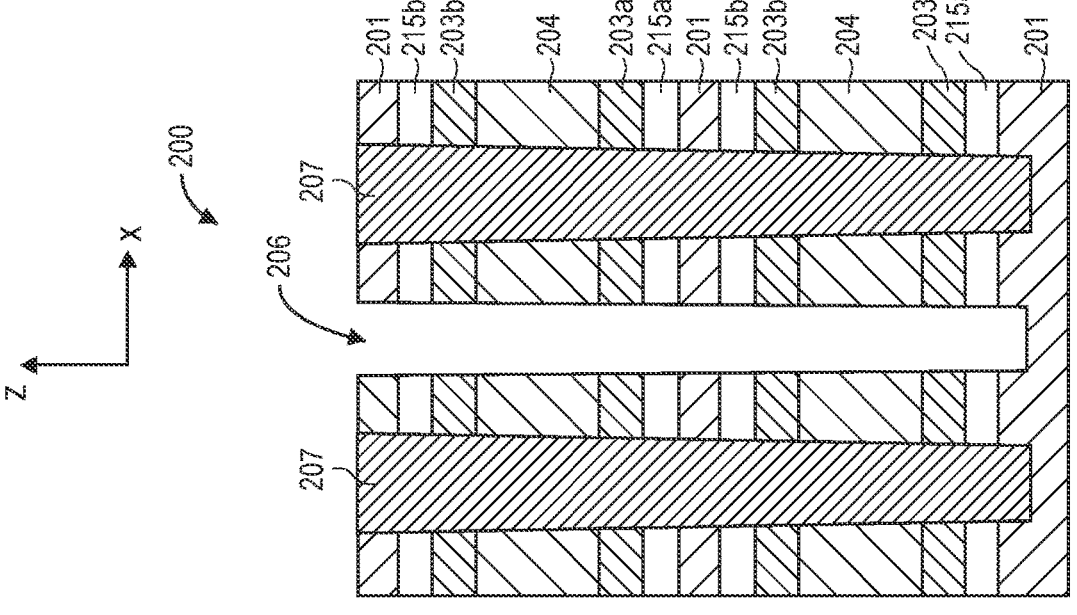

Thereafter, as shown in FIG. 2(e), first and second silicon nitride layers 202a and 202b are then removed using, for example, a wet etch, thereby creating cavities 215a and 215b. FIG. 2(e) shows resulting memory structure 200. Cavities 215a and 215b are filled by conductive layers 211a and 211b, respectively. Conductive layers 211a and 211b are each formed by successively deposited titanium nitride (TiN) liner and tungsten (W). The TiN liner may be formed using, for example, an atomic layer deposition (ALD) technique. An etching step removes the deposited material from the sidewalls of trenches 206 using, for example, a wet etch. This removal step also recesses conductive layer 211a and 211b to create recesses 216 by a small suitable distance (e.g., by 5 nm). Excess deposited materials may be removed from the top of memory structure 200 by CMP. FIG. 2(f) illustrates resulting memory structure 200.

Figure 2H:
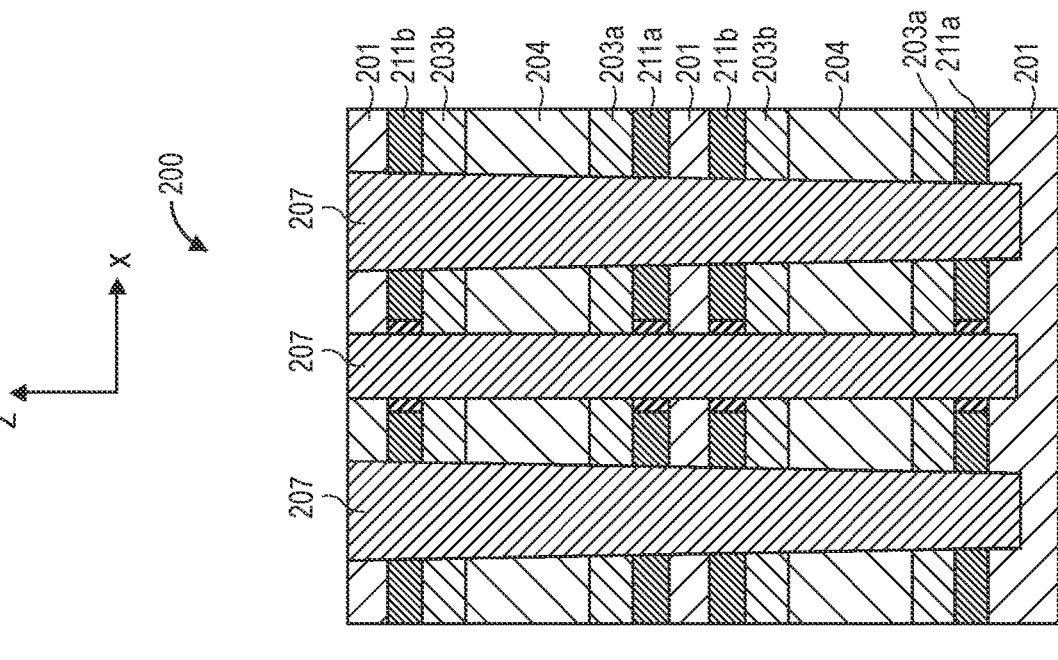
Figure 2G:
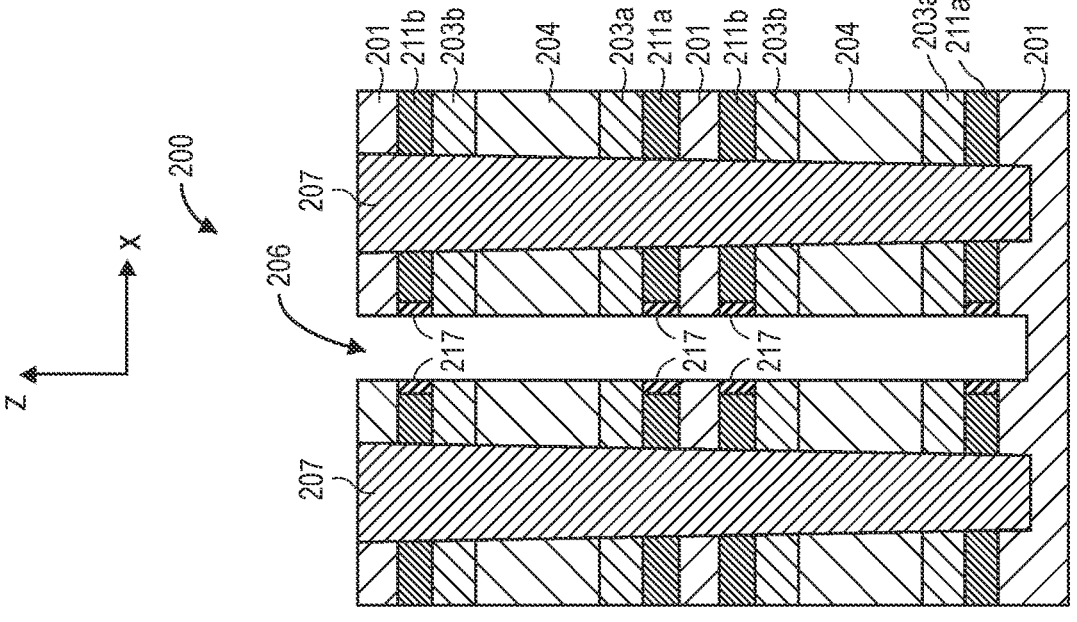

First and second phosphorus-doped amorphous silicon layer 203a and 203b provide the common source line and the common bit line of an HNOR memory string to be formed. Conductive layers 211a and 211b reduce the resistivity of their adjacent common source line or common bit line. Polysilicon liner layer 217 is then deposited into recesses 216, followed by an etch-back step that removes excess polysilicon liner material from the sidewalls of second set of trenches 206. FIG. 2(g) shows resulting memory structure 200. Dielectric material 207 then fills second set of trenches 206. FIG. 2(h) shows resulting memory structure 200.

Polysilicon liner layer 217 prevents conductive layers 211a and 211b from oxidation as being in contact with dielectric material 207.

Figure 2I:
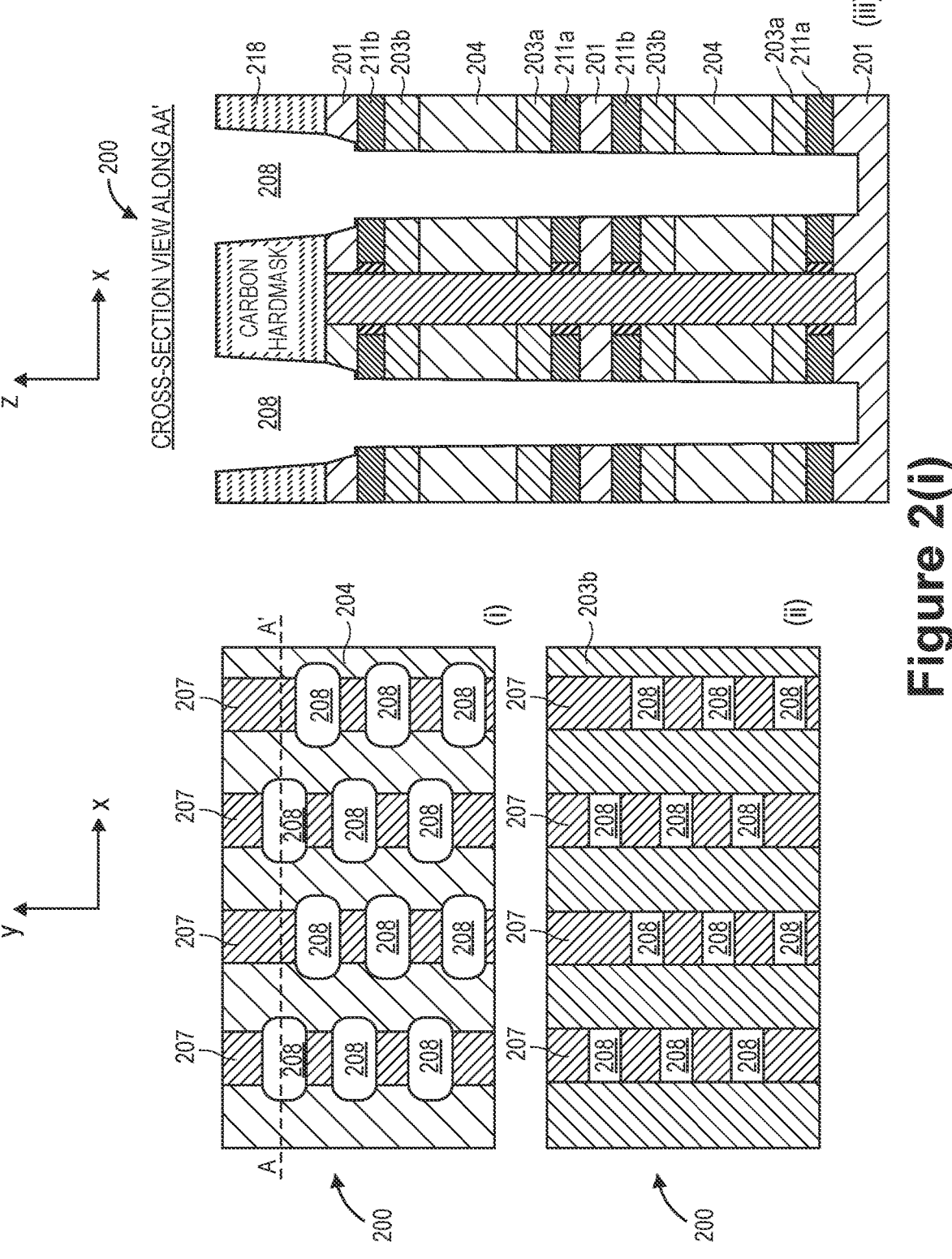

Vias 208 are then patterned and cut in dielectric material 207 using, for example, an anisotropic etch. As the anisotropic etch is of a high aspect ratio, hard mask 218 is used, which provides extraordinary mechanical support. FIG. 2(i) shows resulting memory structure 200. FIG. 2(i), as well as FIGS. 2(j) and 2(k) in the following, each include three views. View (i) is a horizontal cross-section (i.e., in an X-Y plane) through carbon layer 204, view (ii) is a horizontal cross-section through first phosphorus-doped amorphous silicon layer 203b, and view (iii) is a vertical cross-section (i.e., in an X-Z plane) along line A-A' of view (i). Vias 208 may each have an oval X-Y horizonal cross-section with suitable dimensions (e.g., substantially the same as vias 108 discussed above).

Figure 2J:
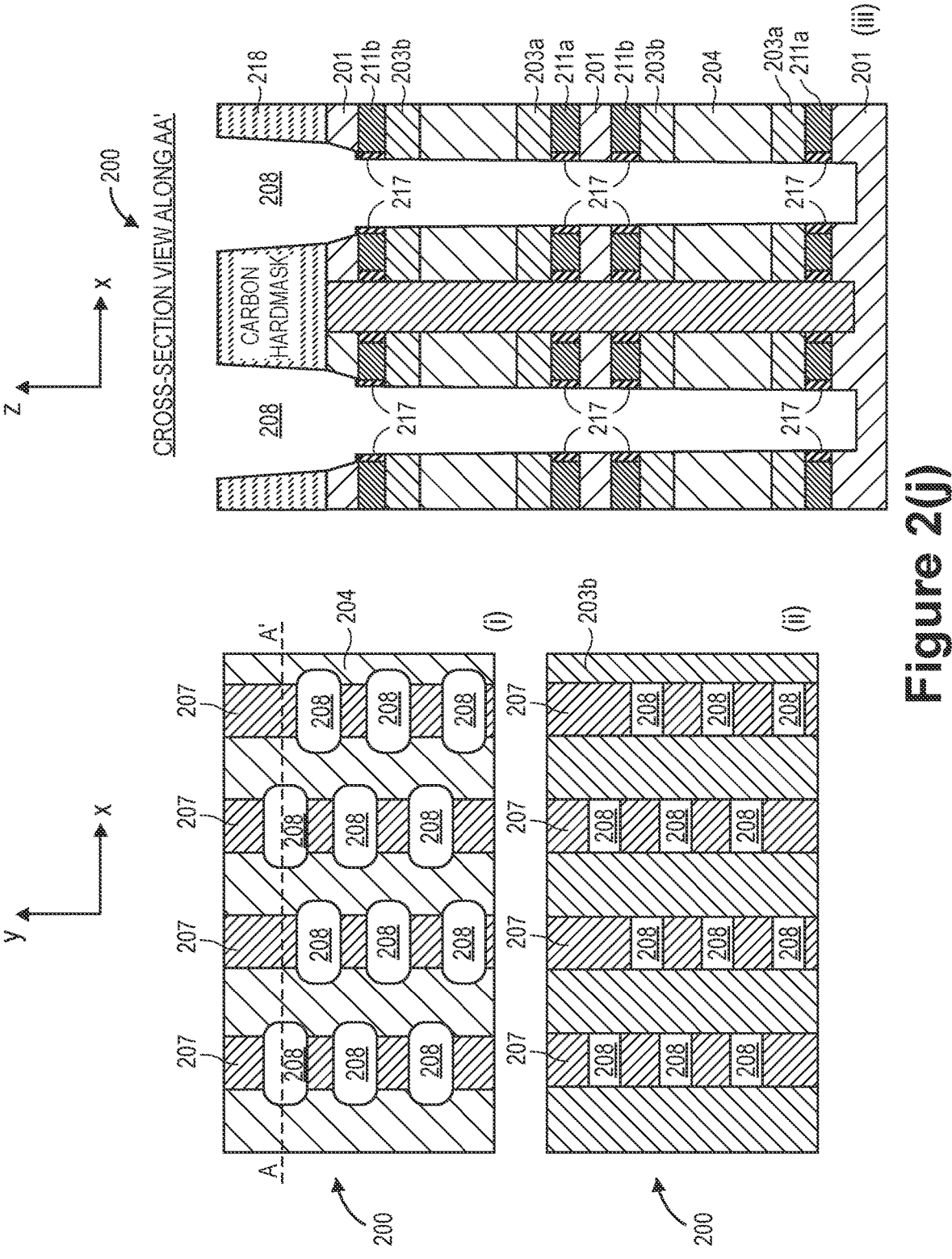
Figure 2K:
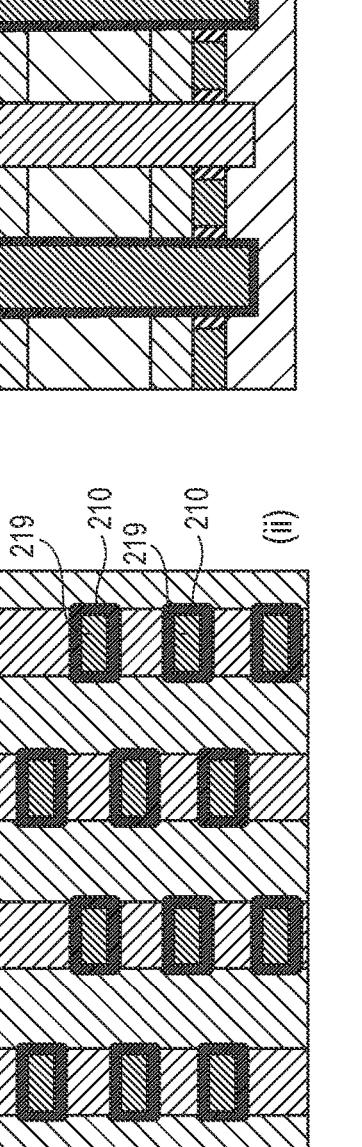
Figure 2I:
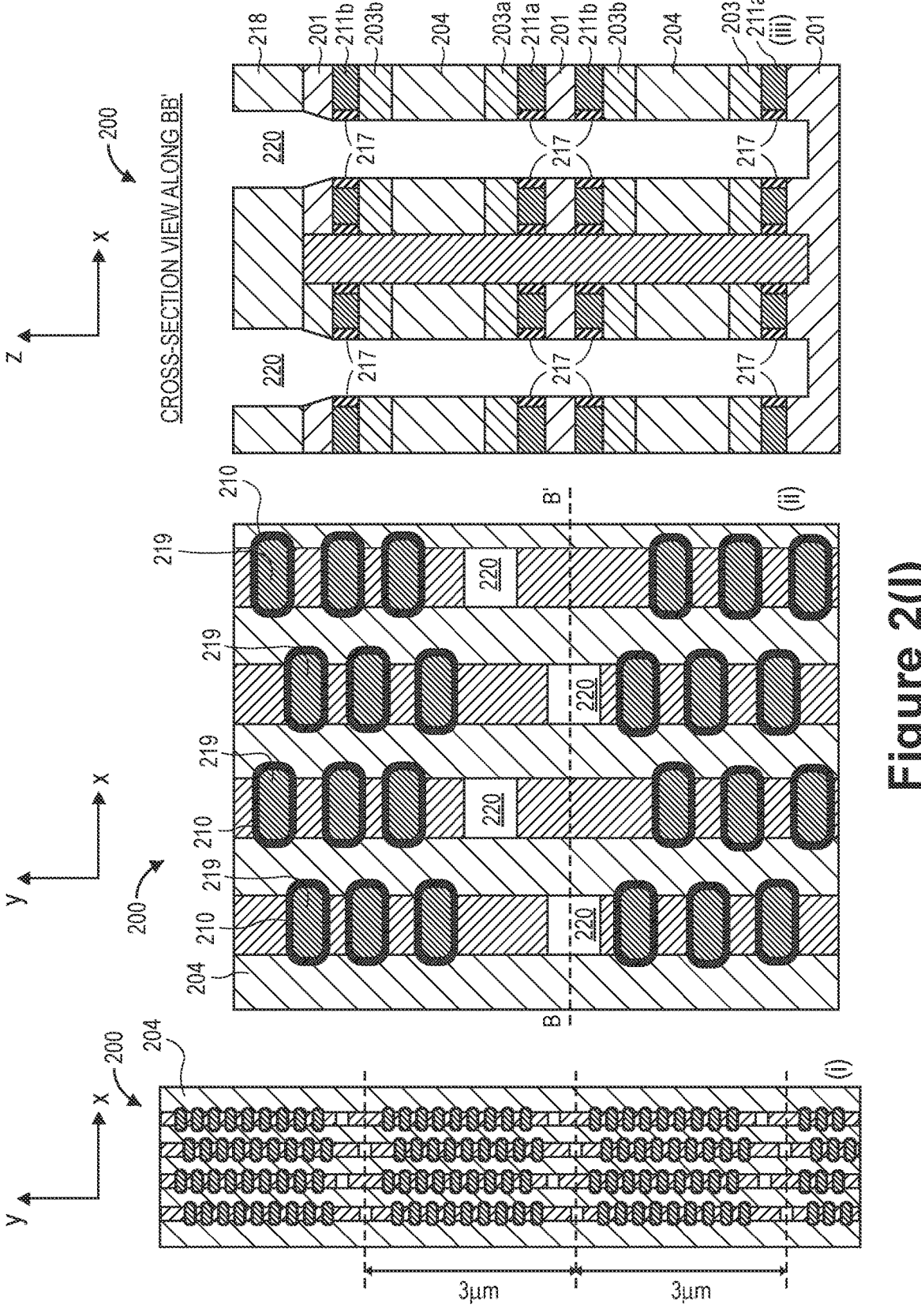

Because vias 208 exposes conductive layers 211a and 211b, to protect conductive layers 211a and 211b, the recess etch and deposition of polysilicon liner steps, described above with respect to FIGS. 2(f) and 2(g), are repeated. FIG. 2(j) shows resulting memory structure 200.

Charge-storage layer 210 is then conformally deposited on the exposed sidewalls of vias 208. In this embodiment, charge-storage ("OZNOA") layer 210 may be a multi-layer including (i) a tunneling dielectric layer (e.g., 1 nm-thick silicon oxide ($SiO_2$)); (ii) a 6-nm thick charge-trapping multilayer that includes zirconium oxide (ZrO), silicon nitride (SiN) and $SiO_2$; and (iii) a 3-nm thick blocking layer (e.g., $Al_2O_3$). (These dimensions are provided merely for illustrative purposes; any suitable thicknesses or dimensions may be used.) As known to those of ordinary skill in the art, each of these materials need not be the stoichiometric compounds. For example, the silicon nitride in the charge-trapping layer may be silicon-rich nitride. Thereafter, vias 208 are filled by conductive layer 219, which includes successively deposited titanium nitride (TiN) liner and tungsten (W). The TiN liner may be formed using, for example, an atomic layer deposition (ALD) technique. Excess deposited materials may be removed from the top of memory structure 200 by CMP. FIG. 2(j) illustrates resulting memory structure 200.

Figure 2M:
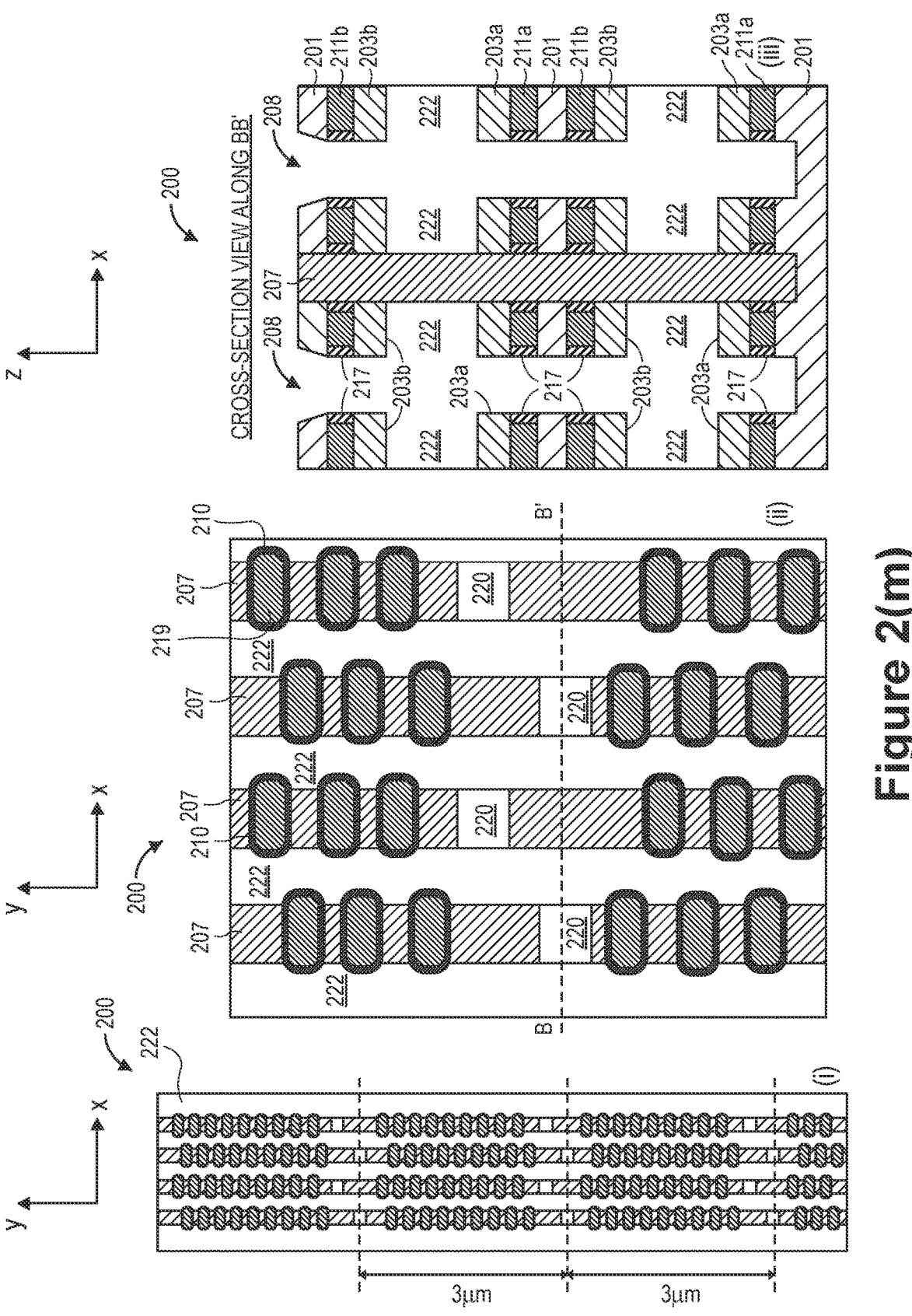
Figure 2N:
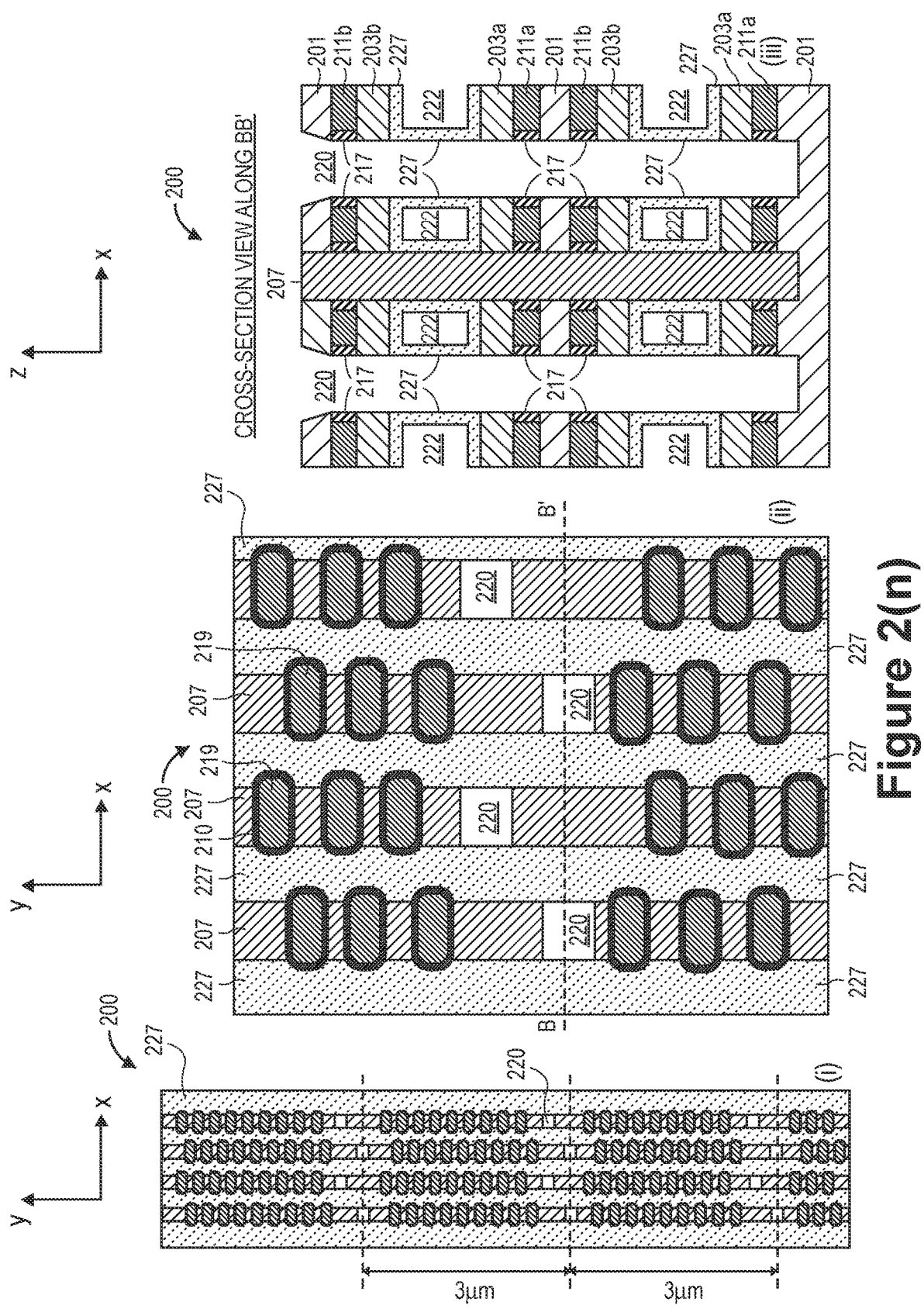
Figure 2O:
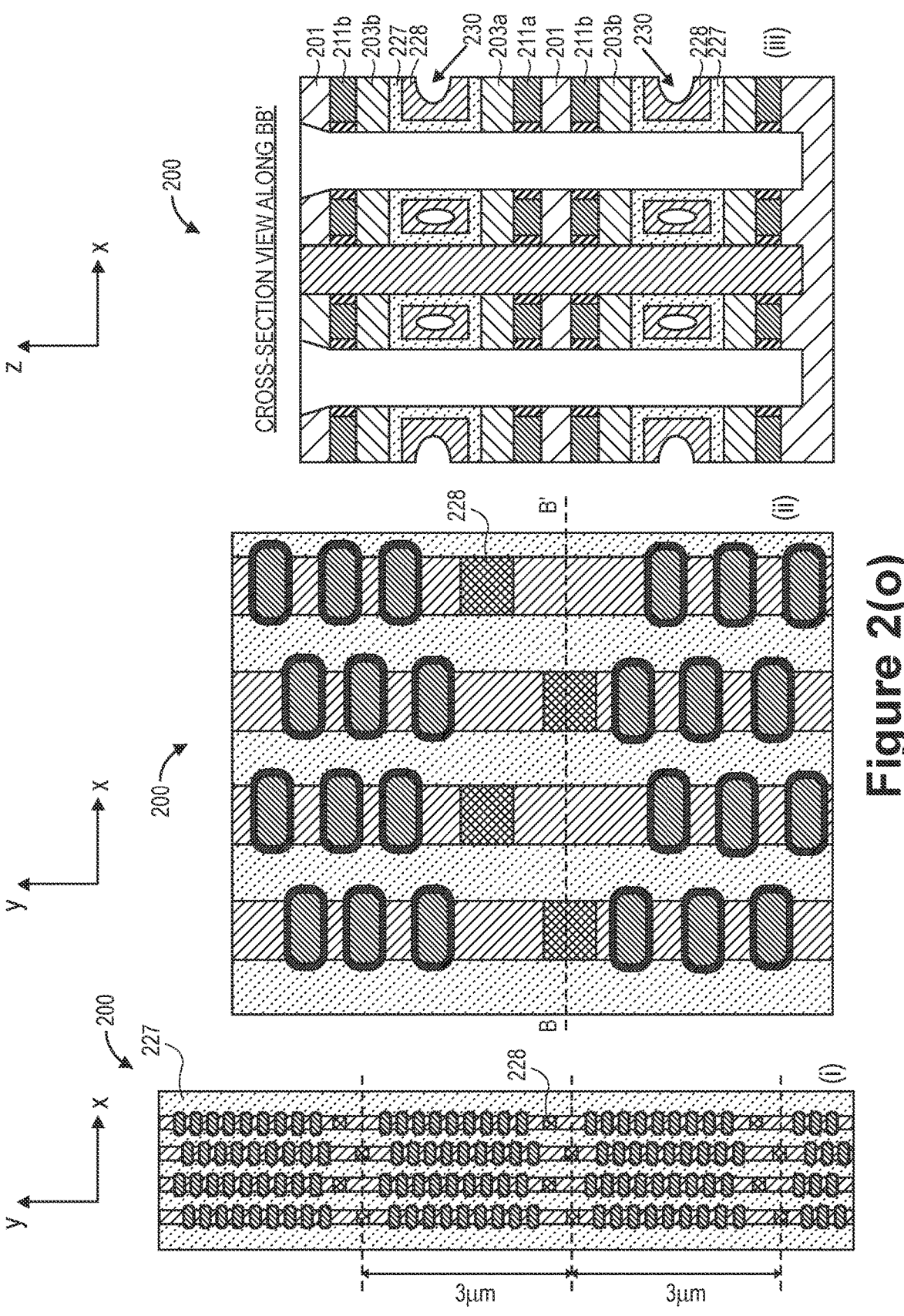

In this embodiment, the channel regions for the storage transistors in a HNOR memory string is provided by depositing a p⁻ polysilicon liner in a cavity created by removal of carbon layer 204. Removal of carbon layer 204 is accomplished by gaseous evacuation through vias or shafts to be cut in each active stack, as disclosed next FIGS. 2(l) to 2(o) illustrate formation of the channel regions following removal of sacrificial carbon layer 204, according to one embodiment of the present invention. FIGS. 2(l) to 2(n) each include 3 views. View (i) is an X-Y cross-section through carbon layer 204 of an active strip, showing locations of shafts 220 cut in the dielectric material 207 filling the trenches 206 to facilitate gaseous removal of carbon layer 204. View (ii) shows the same X-Y cross-section through carbon layer 204 as in view (i), but at a higher resolution. View (iii) is an X-Z cross-section, taken in a plane through line B-B' of view (i), which runs along the X-direction through two of shafts 220. FIG. 2(l) shows memory structure 200 after shafts 220 are cut using, for example, an anisotropic etch. As shown in view (i) of FIG. 2(k), shafts 220 are cut in each active stack at 3-μm intervals along the Y-direction. Providing shafts 220 at any suitable interval may also be used.

Carbon layer 204 may then be removed in an ashing step as gaseous carbon oxide, using substantially the same the same ashing step technique as illustrated above with respect to FIG. 1(*e*) (e.g., 275° C., dry oxygen ($O_2$) ambient), leaving cavities 222. As described above, being amenable to removal by ashing is a significant advantage that carbon has over other sacrificial materials, as the input reactant gases (e.g., oxygen) are readily available, and the resulting and byproduct gases (e.g., $CO_2$) are easily handled and disposed, unlike the reactants of common wet etches, for example, which may include toxic, hazardous, or noxious chemicals or gases that require additional treatment. FIG. 2(*m*) illustrates resulting memory structure 200.

P⁻ polysilicon liner layer 227 is then deposited into cavities 222 (e.g., 20 nm thick), followed by an etch-back step that removes excess polysilicon from the sidewalls of shafts 220. FIG. 2(*n*) shows resulting memory structure 200. Along the X-direction, p⁻ polysilicon liner layer 227 contacts both charge storage layer 210, deposited previously on the sidewalls of vias 208, and dielectric material 207, deposited previously on the sidewalls of trenches 206. A storage transistor is formed by the common source line (i.e., second phosphorus-doped amorphous silicon layer 203*b*), the common bit line (i.e., first phosphorus-doped amorphous silicon layer 203*a*), a channel region (i.e., p⁻ polysilicon liner layer 227), the portion of charge storage layer 210 in contact with the channel region, and the gate electrode enclosed by that charge storage layer 210.

Dielectric material 228 (e.g., $SiO_2$) then shafts 220. Excess material on top of memory structure 200 may be removed by CMP. FIG. 2(*n*) shows resulting memory structure 200. In FIG. 2(*o*) shows that, due to the length of cavities 222 along the Y-direction, dielectric material 228 may not completely fill cavities 222, and thus may leave voids 230.

The above detailed description is provided to illustrate specific embodiments of the present invention and is not intended to be limiting. Numerous modifications and variations within the scope of the present invention are possible. The present invention is set forth in the accompanying claims.

We claim:

1. A process suitable for use in fabricating storage transistors of a NOR memory string above a planar surface of a semiconductor substrate, comprising:

above the planar surface, repeatedly depositing, alternately and one over another, a multi-layer and an isolation dielectric layer, each multilayer comprising first and second semiconductor layers, each of a first conductivity type, a carbon layer between the first and the second semiconductor layers;

cutting a plurality of trenches into the multilayers and the isolation dielectric layers, thereby (1) exposing the carbon layers, the first and the second semiconductor layers and the isolation dielectric layers at the sidewalls of the trenches, each trench having (i) a depth that extends along a first direction that is substantially normal to the planar surface, (ii) a length that extends along a second direction that is substantially parallel to the planar surface, (iii) a width that extends along a third direction that is substantially orthogonal to the depth and the length, the length of the trench being substantially greater than its width; and (2) dividing the multi-layers into a plurality of stacks of multi-layer strips, each stack being separated from an adjacent stack by the width of one of the trenches, with each multi-layer strip being the portion of a multi-layer between adjacent trenches;

filling the trenches with a dielectric filler material;

cutting a plurality of via openings in the dielectric filler material of each trench;

depositing into each via opening a charge-storage layer and a conductor;

cutting a plurality of shafts at predetermined locations into stack of multi-layer strips, thereby exposing the carbon layer of each multi-layer strip in each stack to the shaft; and through the shafts, in place of each carbon layer of each multi-layer strip, providing a third semiconductor layer of a second conductivity type.

2. The process of claim 1 wherein the multi-layer further comprises a first sacrificial layer in contact with the first semiconductor layer or the second semiconductor layer.

3. The process of claim 2, wherein the first sacrificial layer is replaced by a conductive material after the trenches are cut.

4. The process of claim 1, wherein the charge-storage layer comprises a tunneling layer, a charge-trapping layer and a blocking layer.

5. The process of claim 1, wherein the charge-storage layer comprises one or more of: silicon oxide, zirconium oxide, one or more multi-layers each comprising silicon oxide and silicon nitride, aluminum oxide, and any combination thereof.

6. The process of claim 1, wherein providing a third semiconductor layer of a second conductivity type in place of each carbon layer of each multi-layer strip comprises:

removing each carbon layer by an ashing step that converts the carbon layers into carbon oxide gases, which are then expelled through the shafts, thereby creating a space in place of the carbon layers; and depositing the third semiconductor layer into the space.

7. The process of claim 6, wherein the third semiconductor layer comprises a conformal polysilicon liner.

8. The process of claim 7, further comprising filling the remainder of the space by a second dielectric filler material.

9. The process of claim 1, wherein the isolation dielectric layer comprises a dielectric material.

10. The process of claim 1, wherein the isolation dielectric layer comprises silicon oxycarbon.

11. The process of claim 1, wherein the trenches are cut in multiple phases wherein, in each phase, a portion of the trenches are cut and filled with the first sacrificial material.

12. The process of claim 1, wherein the first semiconductor layer, the second semiconductor layer, the third semiconductor layer, the charge-storage layer and the conductor provide a bit line, a source line, a channel region, a charge-storage region and a gate electrode, respectively, of a storage transistor of the NOR memory string.

13. The process of claim 12, wherein the storage transistors of the NOR memory string share the source line and the bit line.

* * * * *